(12) United States Patent
Osame et al.

(10) Patent No.: US 7,755,581 B2
(45) Date of Patent: Jul. 13, 2010

(54) SEMICONDUCTOR DEVICE, DISPLAY DEVICE HAVING THE SAME AND ELECTRONIC APPLIANCE

(75) Inventors: Mitsuaki Osame, Kanagawa (JP); Aya Miyazaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 245 days.

(21) Appl. No.: 11/910,928

(22) PCT Filed: Apr. 10, 2006

(86) PCT No.: PCT/JP2006/307990

§ 371 (c)(1),
(2), (4) Date: Oct. 8, 2007

(87) PCT Pub. No.: WO2006/112421

PCT Pub. Date: Oct. 26, 2006

(65) Prior Publication Data

US 2009/0079350 A1 Mar. 26, 2009

(30) Foreign Application Priority Data

Apr. 18, 2005 (JP) .............................. 2005-119676

(51) Int. Cl.
*G09G 3/32* (2006.01)
(52) U.S. Cl. .......................... 345/82; 345/46; 315/169.3
(58) Field of Classification Search .................. 315/161, 315/165, 169.3; 345/46, 55, 82, 83
See application file for complete search history.

(56) References Cited

U.S. PATENT DOCUMENTS 5,287,205 A    2/1994   Yamazaki et al.
5,568,288 A   10/1996   Yamazaki et al.
5,933,205 A    8/1999   Yamazaki et al.

(Continued)

FOREIGN PATENT DOCUMENTS

JP    2001-109432    4/2001

(Continued)

OTHER PUBLICATIONS

International Search Report re application No. PCT/JP2006/307990, dated Jul. 18, 2006.

(Continued)

*Primary Examiner*—Thuy Vinh Tran
(74) *Attorney, Agent, or Firm*—Cook Alex Ltd.

(57) ABSTRACT

The present invention provides a semiconductor device and its driving method in which amplitude of a data line is decreased to reduce power consumption. In a reset period, a reset transistor and a switch transistor are turned on. In the reset period, an input of a potential from the reset transistor is dominant in a node D, and a selection transistor is turned off when a potential of the node D gets higher than a gate potential of the selection transistor. Thus, even though a potential of the data line changes, a potential of the node G does not change. Since the potential of the data line is not directly written in a gate of a driver transistor, it is possible to separately set an on/off potential to be applied to the gate of the driver transistor and the amplitude of the data line.

27 Claims, 17 Drawing Sheets

U.S. PATENT DOCUMENTS

| | | | |
|---|---|---|---|
| 5,963,278 A | 10/1999 | Yamazaki et al. | |
| 6,380,689 B1 | 4/2002 | Okuda | |
| 6,436,815 B1 | 8/2002 | Yamazaki et al. | |
| 6,437,367 B1 | 8/2002 | Yamazaki et al. | |
| 6,738,034 B2* | 5/2004 | Kaneko et al. | 345/76 |
| 7,173,593 B2 | 2/2007 | Matsumura et al. | |
| 7,180,245 B2* | 2/2007 | Yamazaki et al. | 315/169.3 |
| 7,221,343 B2 | 5/2007 | Kageyama et al. | |
| 7,250,928 B2* | 7/2007 | Yamazaki et al. | 345/76 |
| 7,358,942 B2* | 4/2008 | Yamazaki et al. | 345/82 |
| 7,463,224 B2* | 12/2008 | Sano | 345/76 |

FOREIGN PATENT DOCUMENTS

| | | |
|---|---|---|
| JP | 2003-330415 | 11/2003 |
| JP | 2004-163903 | 6/2004 |

OTHER PUBLICATIONS

Written Opinion re application No. PCT/JP2006/307990, dated Jul. 18, 2006.

Mizukami, M. et al, "36.1: 6-Bit Digital VGA OLED," SID 00 Digest, 2000, pp. 912-915.

\* cited by examiner

SEMICONDUCTOR DEVICE, DISPLAY DEVICE HAVING THE SAME AND ELECTRONIC APPLIANCE

This Application is a National Phase Application filed under 35 U.S.C. 371 claiming the benefit of priority of PCT/JP2006/307990 filed Apr. 10, 2006, having a priority benefit of a Japanese application No. 2005-119676 filed Apr. 18, 2005.

TECHNICAL FIELD

The present invention relates to a semiconductor device. In particular, the present invention relates to a structure of a pixel in an active matrix display which includes a light-emitting element and which is manufactured using a semiconductor device. Moreover, the present invention relates to a display device equipped with the semiconductor device, and an electronic appliance equipped with the display device.

A semiconductor device herein described indicates any device which can function by using a semiconductor characteristic.

BACKGROUND ART

In recent years, demand for thin displays mainly applied to TVs, PC monitors, mobile terminals, and the like have increased rapidly and further development has been promoted. The thin displays include a liquid crystal display device (LCD) and a display device equipped with a light-emitting element. In particular, an active matrix display using a light-emitting element is expected as a next-generation display for its features of high response speed, wide viewing angle, and the like in addition to advantages of a conventional LCD such as thinness, lightness in weight, and high image quality.

In an active matrix display using a light-emitting element, a structure shown in FIG. 17A is given as the most basic pixel structure (see Non-Patent Document 1: M. Mizukami, K. Inukai, H. Yamagata, et al., SID '00 Digest, vol. 31, pp. 912-915). In FIG. 17A, each pixel has a driver transistor 202 for controlling current supply to a light-emitting element 204, a switch transistor 201 for taking a potential of a data line 206 into a gate node G of the driver transistor 202 by a scan line 205, and a holding capacitor 203 for holding the potential of the node G.

DISCLOSURE OF INVENTION

In FIG. 17A, the light-emitting element 204 can be driven by an analog driving method or a digital driving method. In the analog driving method, an analog value is supplied to the gate node G of the driver transistor 202 and the analog value is changed continuously, thereby expressing grayscale. In the digital driving method, a digital value is supplied to the node G, thereby expressing grayscale. The expression of grayscale is performed by a digital time grayscale method in which a light-emission period is changed continuously. The digital driving is advantageous in point of high image quality as compared with the analog driving, because the digital driving is hard to be affected by variation in TFTs.

A specific example of a potential relation and operation timing when driving the pixel in FIG. 17A is shown in FIG. 17B, and the operation is described. At this time, the light-emitting element 204 is driven by the digital driving method.

In FIG. 17A, a potential of a counter electrode of the light-emitting element 204 is set to be GND (hereinafter 0 V), a potential of a current supply line 207 is set to be 7 V, a High potential of the data line 206 is set to be 7 V and a Low potential thereof is set to be 0 V, and a High potential of a scan line 205 is set to be 10 V and a Low potential thereof is set to be 0 V.

In a period while the scan line 205 has a potential of 10 V, the switch transistor 201 is turned on, whereby the potential of the data line 206 is applied to the node G. The potential of the data line 206 at the moment when the potential of the scan line 205 is switched from 10 V to 0 V is held at the node G. If the held potential is the High potential 7 V, the driver transistor 202 is turned off and the light-emitting element 204 is in a non-light-emission state. If the held potential is the Low potential 0 V, the driver transistor 202 is turned on and the light-emitting element 204 is in a light-emission state. At this time, since the driver transistor 202 operates in a linear region, Vds (source-drain voltage) is extremely low and a potential difference of about 7 V is generated between opposite electrodes of the light-emitting element 204, whereby current flows in the light-emitting element 204.

In the pixel structure described here, the potential of the data line 206 is written in the node G. Since the driver transistor 202 is turned on or off depending on the potential of the node G, it is necessary that at least the High potential of the data line 206 is the same as or higher than the potential of the current supply line 207 and that, in the case of digital driving, the Low potential is the potential to turn on the driver transistor 202 in a linear region.

Selection pulses are sequentially outputted from a scan line driver circuit to the respective rows of the scan line 205, and data signals are outputted from a data line driver circuit to the respective columns of the data line 206 in accordance with the selection pulses.

Electric power in a buffer portion in the data line driver circuit for charging/discharging the data line 206 is dominant in the power consumption of the driver circuits. The power consumption P is generally calculated from the following formula (I), where F is frequency, C is capacitance, and V is voltage.

$$P=FCV^2 \tag{1}$$

Therefore, it is understood from the formula (1) that decreasing the amplitude of the data line 206 is effective to reduce the power consumption.

However, in consideration of variation in threshold and fluctuation in threshold due to temperature between the driver transistors 202, noise in a holding period, off-leak of the switch transistor 201, and the like, it is not easy to decrease the amplitude of the data line 206. Moreover, in the time grayscale method, one frame period is divided into a plurality of sub-frames to control a light-emission period; therefore, the number of times of charging/discharging the data line 206 increases, which further affects the power consumption of the data line driver circuit.

In view of the above problem, the present invention provides a semiconductor device and its driving method, in which the amplitude of the data line is made small to reduce the power consumption by not writing the potential of the data line in the driver transistor.

A semiconductor device of the present invention includes a light-emitting element, a scan line, a data line, a current supply line, a node, a first transistor of which a gate is connected to the node and one of a source and a drain is connected to the current supply line and the other is connected to one electrode of the light-emitting element, a second transistor which is turned on or off depending on potentials of the data line and the scan line and which determines a potential of the node, and a means for setting the potential of the node so as to be a potential for turning off the first transistor without depending on the potential of the data line.

A semiconductor device of the present invention includes a light-emitting element, a scan line, a data line, a current supply line, first and second nodes, a first transistor of which a gate is connected to the first node and one of a source and a drain is connected to the current supply line and the other is connected to one electrode of the light-emitting element, a second transistor which is turned on or off depending on potentials of the data line and the scan line and which determines a potential of the second node, a means for setting the potential of the second node so as to be a potential for turning off the first transistor without depending on fluctuation of the potential of the data line, and a switch for controlling electrical connection or disconnection between the first node and the second node.

In these semiconductor devices of the present invention, the potential of the current supply line is higher than the potential of the other electrode of the light-emitting element. Moreover, the first transistor is a P-channel transistor and the second transistor is an N-channel transistor.

A semiconductor device of the present invention includes a first transistor of which one of a source and a drain is connected to a current supply line, a light-emitting element of which one electrode is connected to the other of the source and the drain of the first transistor, and a second transistor of which one of a source and a drain is connected to a scan line, wherein a gate of the second transistor is connected to a data line, and wherein the other of the source and the drain of the second transistor is connected to a gate of the first transistor.

A semiconductor device of the present invention includes a first transistor of which one of a source and a drain is connected to a current supply line, a light-emitting element of which one electrode is connected to the other of the source and a drain of the first transistor, a second transistor of which one of a source and a drain is connected to a first scan line, and a third transistor of which a gate is connected to a second scan line, wherein a gate of the second transistor is connected to a data line, and wherein the other of the source and the drain of the second transistor is connected to a gate of the first transistor through the third transistor.

A semiconductor device of the present invention includes a first transistor of which one of a source and a drain is connected to a current supply line, a light-emitting element of which one electrode is connected to the other of the source and the drain of the first transistor, a second transistor of which one of a source and a drain is connected to a first scan line, a third transistor of which a gate and one of a source and a drain are connected to the first scan line, and a fourth transistor of which a gate is connected to a second scan line, wherein a gate of the second transistor is connected to the data line, wherein the other of the source and the drain of the second transistor is connected to a gate of the first transistor through the fourth transistor, and wherein the other of the source and the drain of the second transistor is connected to the other of the source and the drain of the third transistor.

A semiconductor device of the present invention includes a first transistor of which one of a source and a drain is connected to a current supply line, a light-emitting element of which one electrode is connected to the other of the source and the drain of the first transistor, a second transistor of which one of a source and a drain is connected to a first scan line, a third transistor of which a gate is connected to the first scan line and one of a source and a drain is connected to a wire, and a fourth transistor of which a gate is connected to a second scan line, wherein a gate of the second transistor is connected to a data line, wherein the other of the source and the drain of the second transistor is connected to a gate of the first transistor through the fourth transistor, and wherein the other of the source and the drain of the second transistor is connected to the other of the source and the drain of the third transistor. Further, the current supply line can be used as the wire.

The third transistor in the present invention can be a diode of which one electrode is connected to the first scan line and the other electrode is connected to the source or the drain of the second transistor.

Moreover, the semiconductor device may have a means for inputting a signal for turning off the first transistor to the gate of the first transistor, in addition to a signal for controlling light-emission or non-light-emission of the light-emitting element to be inputted to the gate of the second transistor from the data line.

Further, the semiconductor device may have a means for inputting a signal for turning off the first transistor into the gate of the first transistor before inputting the signal for controlling light-emission or non-light-emission of the light-emitting element to be inputted to the gate of the second transistor from the data line.

The first transistor of the present invention can be a P-channel transistor and the second transistor can be an N-channel transistor.

The potential of the current supply line of the present invention is higher than the potential of a counter electrode of the light-emitting element.

A light-emitting element included in the semiconductor device of the present invention is an EL element having a light-emitting layer exhibiting electroluminescence (hereinafter referred to as EL) between a pair of electrodes.

Electroluminescence from an EL element of which a light-emitting layer is formed with an organic compound includes light emission generated when returning from a singlet excited state to a ground state (fluorescence) and light emission generated when returning from a triplet excited state to the ground state (phosphorescence). A light-emitting element of the present invention can employ either light emission.

An EL element of which a light-emitting layer is formed with an inorganic material emits light in such a way that an electron taken out from an interface between an insulating layer and the light-emitting layer is accelerated at a high electric field and is excited by colliding with a localized light-emission center. As the inorganic material, ZnS, SrS, $BaAl_2S_4$, or the like is given. Further, Mn, Th, Tm, Eu, or the like is given as a light-emission center to be added to the inorganic material.

By using a pixel structure of a semiconductor device of the present invention, it is possible to separately set an on/off potential to be applied to a gate of a driver transistor and an amplitude of a data line. Therefore, a potential to be applied to a gate electrode of a driver transistor of a semiconductor device of the present invention can have enough margin in consideration of switching noise, threshold, off-leak in a light-emission period, and the like.

Further, by using the pixel structure of the semiconductor device of the present invention, the amplitude of the data line can be set to be small. Therefore, the power consumption can be reduced drastically.

BEST MODE FOR CARRYING OUT THE INVENTION

Embodiment Mode 1

Figure 1:
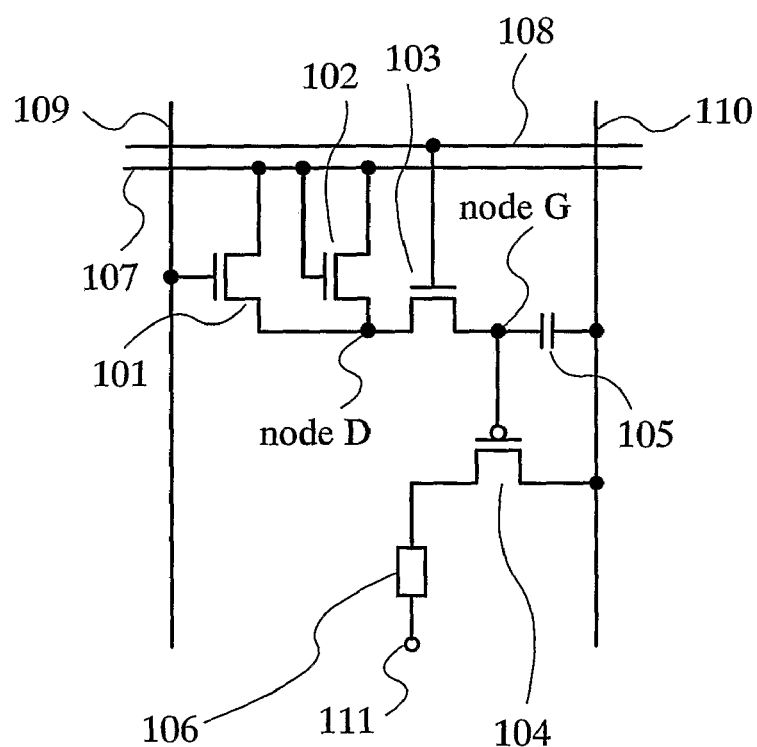
FIG. 1 is a circuit diagram of Embodiment Mode 1.

In a basic structure of a semiconductor device of the present invention, a data line is connected to a gate electrode of a selection transistor and one of a source electrode and a drain electrode of the selection transistor is electrically connected to a gate electrode of a driver transistor.

Specific pixel structure and drive timing are described in detail with reference to FIG. 1. Here, although only one pixel is shown, a pixel portion of the semiconductor device actually has a plurality of pixels arranged in matrix in a row direction and a column direction.

Each pixel of the present invention has a selection transistor 101 (also referred to as a second transistor) and a reset transistor 102 (also referred to as a third transistor) which determine a potential of a node D by a first scan line 107 and a data line 109, a switch transistor 103 (also referred to as a fourth transistor) for electrically connecting the node D and a node G by a second scan line 108, a driver transistor 104 (also referred to as a first transistor) for controlling current supply to a light-emitting element 106 from a current supply line 110 (also referred to as a power source line) by the potential of the node G, and a holding capacitor 105 for holding the potential of the node G. The first transistor 104 is a P-channel transistor while the second transistor 101, the third transistor 102, and the fourth transistor 103 are N-channel transistors. However, the polarity of each transistor is not limited as long as the potentials of wires connected to terminals of the transistors are changed appropriately so that the transistors operate in the same manner as the transistors of the present invention. Moreover, the node G is also referred to as a first node while the node D is also referred to as a second node in this specification.

One of a source and a drain of the first transistor 104 is connected to the current supply line 110. Moreover, the other of the source and the drain of the first transistor 104 is connected to one electrode of the light-emitting element 106. The other electrode of the light-emitting element 106 serves as a counter electrode 111. One of a source and a drain of the second transistor 101 is connected to the first scan line 107. A gate of the second transistor 101 is connected to the data line 109. The other of the source and the drain of the second transistor 101 is connected to one of a source and a drain of the fourth transistor 103. A gate of the fourth transistor 103 is connected to the second scan line 108. The other of the source and the drain of the fourth transistor 103 is connected to a gate of the first transistor 104. Moreover, one electrode of the holding capacitor 105 is connected to the gate of the first transistor 104 while the other electrode is connected to the current supply line 110. A gate and one of a source and a drain of the third transistor 102 are connected to the first scan line 107. The other of the source and the drain of the third transistor 102 is connected to the other of the source and the drain of the second transistor 101.

In this embodiment mode, gate capacitance of the driver transistor 104 may be used to form a capacitor. In this case, the holding capacitor 105 is not necessarily provided.

In this embodiment mode, a diode can be provided instead of the third transistor (reset transistor) 102 as can be clearly seen from the fact that the third transistor 102 is connected so as to serve as a diode.

The counter electrode 111 of the light-emitting element 106 has a lower potential (Vss) than the current supply line 110. Vss satisfies Vss<Vdd where Vdd, which is the potential of the current supply line 110 in a light-emission period of the pixel, is a reference. For example, Vss may be equal to GND (ground potential).

Next, the pixel structure of FIG. 1 is described with reference to FIGS. 2A and 2B and FIGS. 3A and 3B.

Figure 2A:
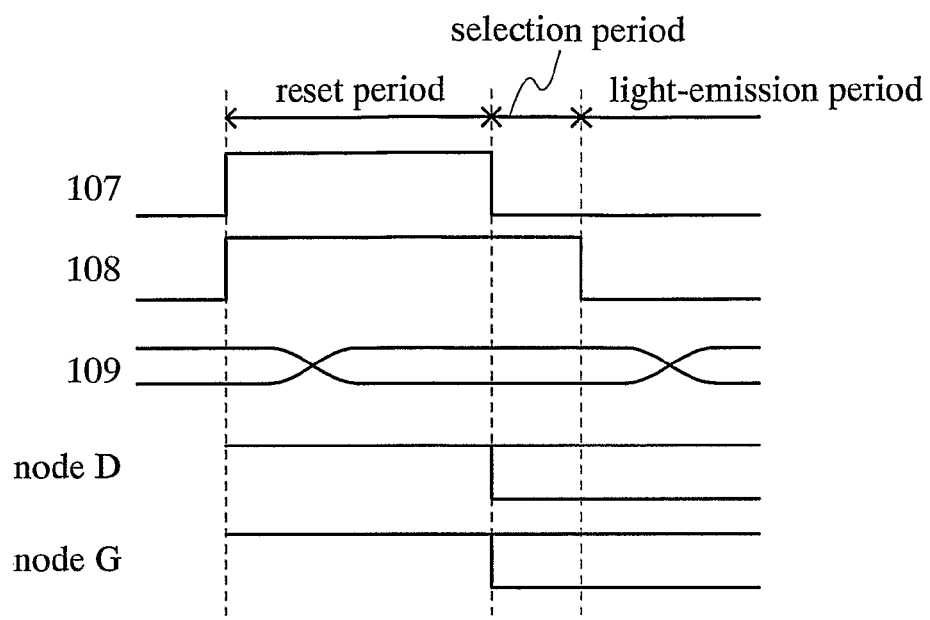
FIGS. 2A and 2B show one mode of Embodiment Mode 1.

FIG. 2A is a timing chart of potentials of the first scan line 107, the second scan line 108, the data line 109, the node D, and the node G in the pixel structure of the present invention. In the pixel structure of the present invention, whether each pixel emits light or not is selected by a reset period, a selection period, or a sustain period (also referred to as a light-emission period or a non-light-emission period).

In the pixel structure of the present invention, the potential for turning on or off the first transistor (driver transistor) is not inputted from the data line. A potential for turning off the driver transistor is inputted in advance to a gate of the driver transistor in the pixel (the first node), i.e., the holding capacitor. A period in which the signal for turning off the driver transistor is inputted in advance to the gate (the first node) of the driver transistor in the pixel is referred to as a reset period in this specification.

Figure 2B:
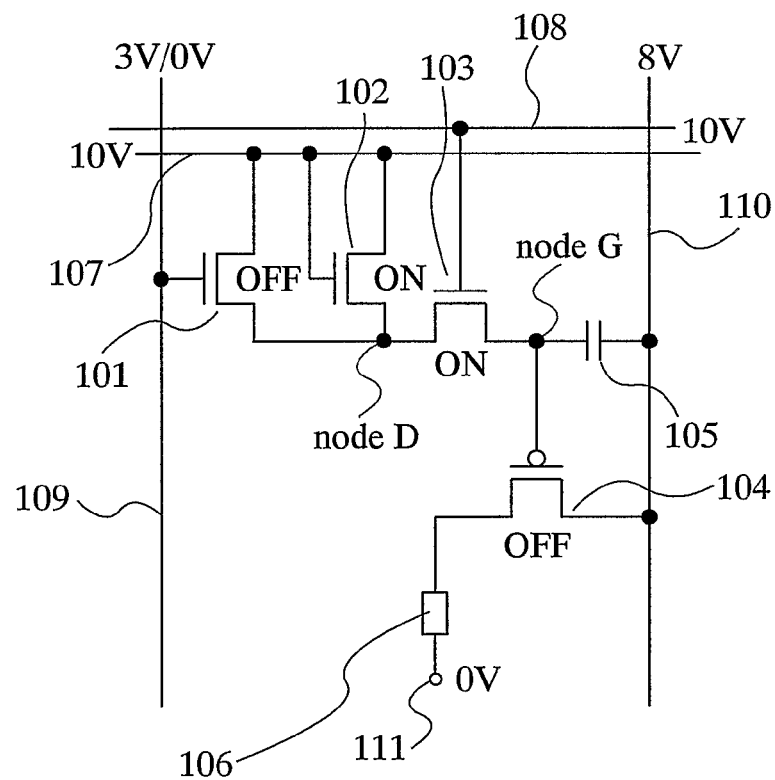

FIG. 2B shows potentials of the wires and turning on or off of the transistors in the reset period in the pixel structure of FIG. 1. In order to describe the driving, specific potentials of the current supply lines are set as follows: a High potential of the data line 109 is 3 V and a Low potential thereof is 0 V, High potentials of the first scan line 107 and the second scan line 108 are 10 V and Low potentials thereof are 0 V, a potential of the current supply line 110 is 8 V, and a potential of the counter electrode 111 of the light-emitting element 106 is 0 V. The specific potentials of the wires shown here are just examples, and the present invention is not limited to these as long as the potentials are those required for turning on or off the transistors.

First, in the reset period, selection pulses are outputted to the first scan line 107 and the second scan line 108 to provide a potential of 10 V, thereby turning on the reset transistor 102 and the switch transistor 103. At this time, if an absolute value of the threshold is 1 V in each transistor, the potentials of the node D and the node G decrease to 9 V, because the potential decreases from the potential of the first scan line 107 by the threshold of the reset transistor 102. Since the current supply line 110 has a potential of 8 V, the driver transistor 104 is turned off.

In this reset period, the selection transistor 101 is turned on depending on the change of the potential of the data line 109. For example, in the case where the node D has a potential of 0 V before the reset period, when the data line 109 has a potential of 3 V, the selection transistor 101 is turned on.

However, in the reset period, the input of the potential from the reset transistor 102 is dominant in the node D and the selection transistor 101 is turned off when the potential of the node D gets higher than the gate potential of the selection transistor 101. Therefore, even though the potential of the data line 109 changes, the potential of a gate terminal of the driver transistor 104 does not change.

Figure 3A:
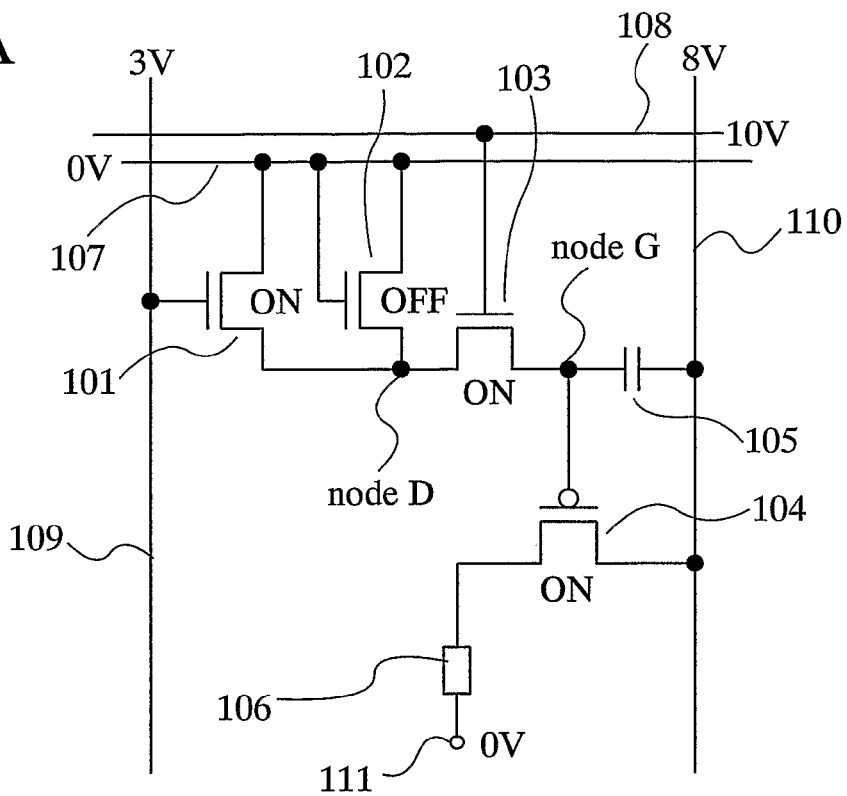
FIGS. 3A and 3B show one mode of Embodiment Mode 1.
Figure 3B:
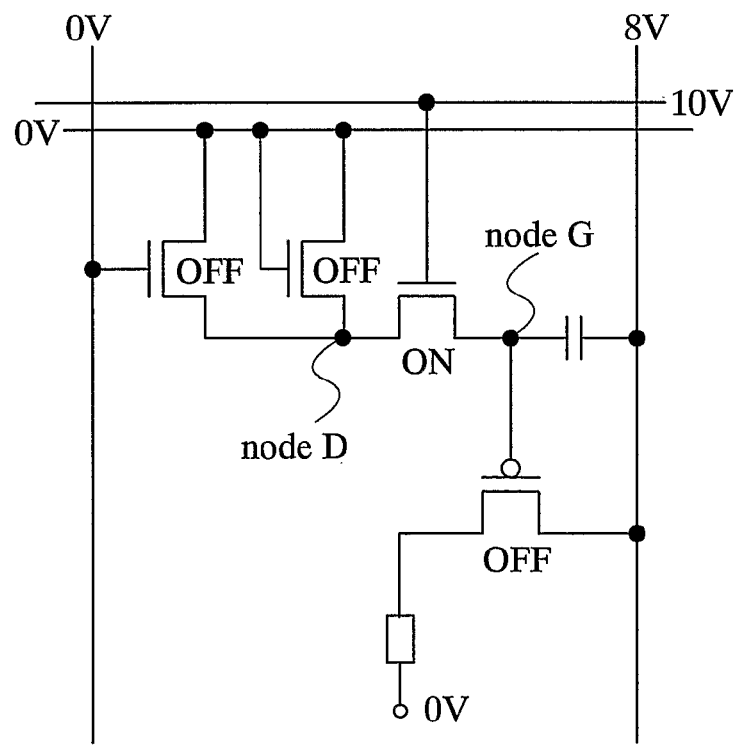

FIGS. 3A and 3B show potentials of the wires and turning on or off of the transistors in the case where a light-emission state or a non-light-emission state of the light-emitting element is selected in the selection period in the pixel structure of FIG. 1. In the selection period, the first scan line 107 has a potential of 0 V.

At this time, when a potential of 3 V as a light-emission signal is inputted to the data line 109, the selection transistor 101 is turned on, the potentials of the node D and the node G become the potential of 0V of the first scan line 107, the driver transistor 104 is turned on, and current flows from the current supply line 110 to the counter electrode 111 of the light-emitting element 106, whereby the light-emitting element 106 emits light as shown in FIG. 3A.

Moreover, when a potential of 0 V as a non-light-emission signal is inputted to the data line 109, the selection transistor 101 remains off and the potentials of the node D and the node G also remain 9 V and the driver transistor 104 also remains off as shown in FIG. 3B.

Subsequently, the light-emission period starts, the second scan line 108 has a potential of 0 V, and the switch transistor 103 is turned off. Then, the potential of the node G determined in the selection period is held by the holding capacitor 105.

As thus described, by using the pixel structure of the semiconductor device of the present invention, it is possible to separately set the on/off potential to be applied to the gate electrode of the first transistor (driver transistor) and the amplitude of the data line. Therefore, the amplitude of the data line can be set to be small, whereby the power consumption can be reduced drastically.

This embodiment mode can be freely combined with other embodiment modes and embodiments.

Embodiment Mode 2

Figure 4:
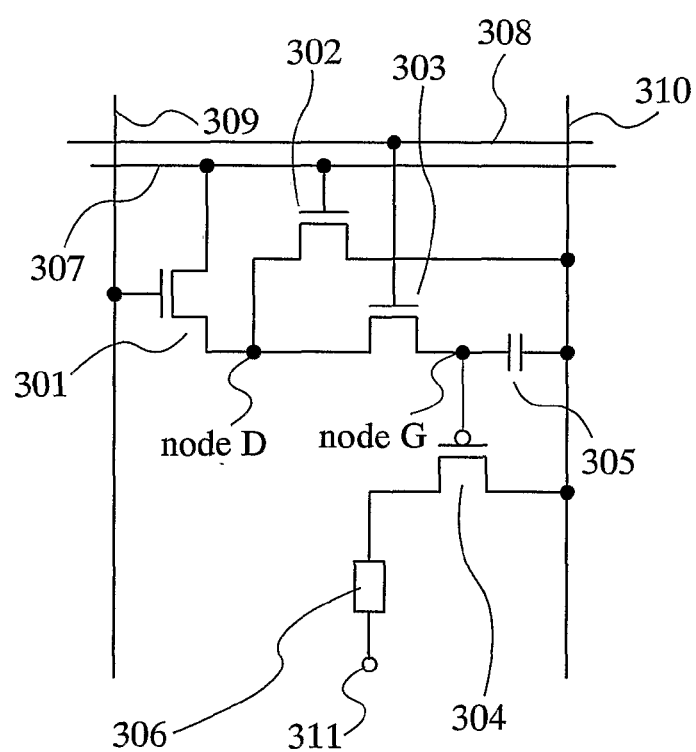
FIG. 4 is a circuit diagram of Embodiment Mode 2.

Embodiment Mode 2 will show an example in which the connection of the reset transistor 102 in the pixel structure shown in FIG. 1 has been changed. FIG. 4 shows a specific structure based on which the description is made. Here, although only one pixel is shown, a pixel portion of a semiconductor device actually has a plurality of pixels arranged in matrix in a row direction and a column direction.

Each pixel of the present invention has a selection transistor (also referred to as a second transistor) 301 and a reset transistor 302 (also referred to as a third transistor) which determine a potential of a node D by a first scan line 307 and a data line 309, a switch transistor 303 (also referred to as a fourth transistor) for electrically connecting the node D and a node G by a second scan line 308, a driver transistor 304 (also referred to as a first transistor) which controls current supply to a light-emitting element 306 from a current supply line 310 by the potential of the node G, and a holding capacitor 305 for holding the potential of the node G.

In this embodiment mode, gate capacitance of the driver transistor 304 may be used to form a capacitor. In this case, the holding capacitor 305 is not necessarily formed.

One of a source and a drain of the first transistor 304 is connected to the current supply line 310 while the other of the source and the drain of the first transistor 304 is connected to one electrode of the light-emitting element 306. The other electrode of the light-emitting element 306 serves as a counter electrode 311. One of a source and a drain of the second transistor 301 is connected to the first scan line 307, a gate of the second transistor 301 is connected to the data line 309, and the other of the source and the drain of the second transistor 301 is connected to one of a source and a drain of the fourth transistor 303. A gate of the fourth transistor 303 is connected to the second scan line while the other of the source and the drain of the fourth transistor 303 is connected to a gate of the first transistor 304. One electrode of the holding capacitor 305 is connected to the gate of the first transistor 304 while the other electrode thereof is connected to the current supply line 310. A gate of the third transistor 302 is connected to the first scan line 307. One of a source and a drain of the third transistor 302 is connected to the current supply line 310. The other of the source and the drain of the third transistor 302 is connected to the other of the source and the drain of the second transistor 301.

Similarly to the reset transistor 102 in FIG. 1, the reset transistor 302 sets a potential of the node D at a High potential of 10V in the reset period, thereby turning off the driver transistor 304. A driving method, timing, and the like in the reset period, the selection period, and the light-emission period are similar to those in FIGS. 2A and 2B and FIGS. 3A and 3B.

In this embodiment mode, one of a source and a drain of the reset transistor 302 is connected to the current supply line 310; however, a current supply line may be additionally provided to be connected to the one of the source and the drain of the reset transistor 302.

This embodiment mode can be freely combined with other embodiment modes and embodiments.

Embodiment Mode 3

Figure 5:
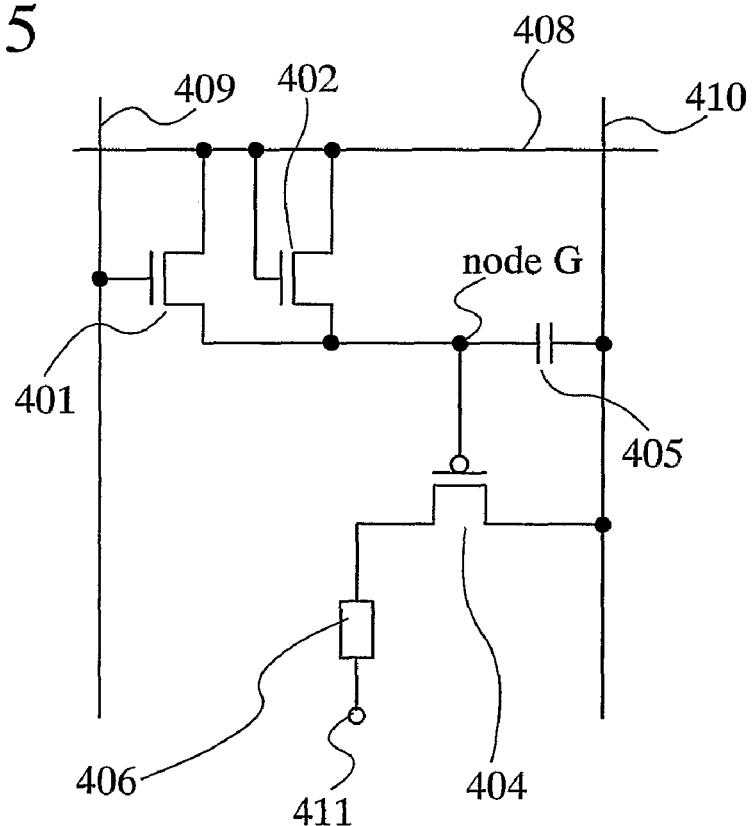
FIG. 5 is a circuit diagram of Embodiment Mode 3.

Embodiment Mode 3 will show an example of a pixel structure, which is different from that shown in FIG. 1. A specific structure is shown in FIG. 5 based on which the description is made. Here, although only one pixel is shown, a pixel portion of a semiconductor device actually has a plurality of pixels arranged in matrix in a row direction and a column direction.

As shown in FIG. 5, each pixel in this embodiment mode has a selection transistor 401 (also referred to as a second transistor) and a reset transistor 402 (also referred to as a third transistor) which determine a potential of a node G by a scan line 408 and a data line 409, a driver transistor 404 (also referred to as a first transistor) which controls current supply from a current supply line 410 to a light-emitting element 406 based on the potential of the node G, and a holding capacitor 405 which holds the potential of the node G. It is to be noted that the first transistor 404 is a P-channel transistor and the second transistor 401 and the third transistor 402 are N-channel transistors. However, the polarity of each transistor is not limited in particular as long as the potentials of wires connected to terminals of the transistors are changed appropriately so that the transistors operate in the same manner as the transistors of the present invention.

In this embodiment mode, gate capacitance of the driver transistor 404 may be used to provide a capacitor. In this case, the holding capacitor 405 is not always necessary.

Further, in this embodiment mode, a diode can be provided instead of the third transistor (reset transistor) 402. This is obvious from the fact that the third transistor 402 is connected so that the third transistor 402 serves as a diode.

A counter electrode 411 of the light-emitting element 406 is set to have a potential Vss which is lower than that of the current supply line 410. Vss satisfies Vss<Vdd, where Vdd, which is a potential of the current supply line 410 in a light-emission period, is a reference. For example, Vss may be equal to GND (ground potential).

Moreover, a High potential of the scan line 408 is set to be higher than the potential of the current supply line 410, a potential thereof in a selection period (this potential is hereinafter referred to as a Low potential 1) is set to be the same as a Low potential of the data line 409, and a potential thereof in a light-emission period (this potential is hereinafter referred to as a Low potential 2) is set to be the same as a High potential of the data line 409.

Next, an operation method with a pixel structure of FIG. 5 is described with reference to FIGS. 6A and 6B, and FIGS. 7A and 7B.

Figure 6A:
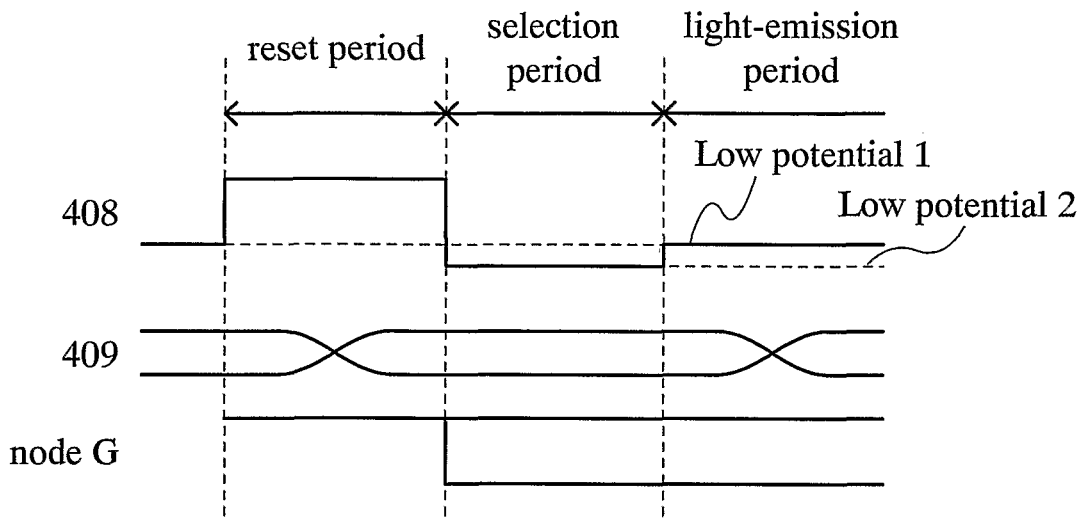
FIGS. 6A and 6B show one mode of Embodiment Mode 3.

FIG. 6A is a timing chart showing potentials of the scan line 408, the data line 409, and the node G in the pixel structure of the present invention. In the pixel structure of the present invention, a light-emission state or a non-light-emission state of each pixel is selected in accordance with a reset period, a selection period, and a sustain period (also referred to as a light-emission period or a non-light-emission period).

In the pixel structure of the present invention, a potential for turning on or off the first transistor (driver transistor) is not inputted from the data line. The potential for turning off the driver transistor is inputted in advance to a gate (a first node) of the driver transistor in a pixel, i.e., a holding capacitor. A period in which a signal for turning off the driver transistor is inputted in advance to the gate of the driver transistor in the pixel is referred to as a reset period in this specification.

Figure 6B:
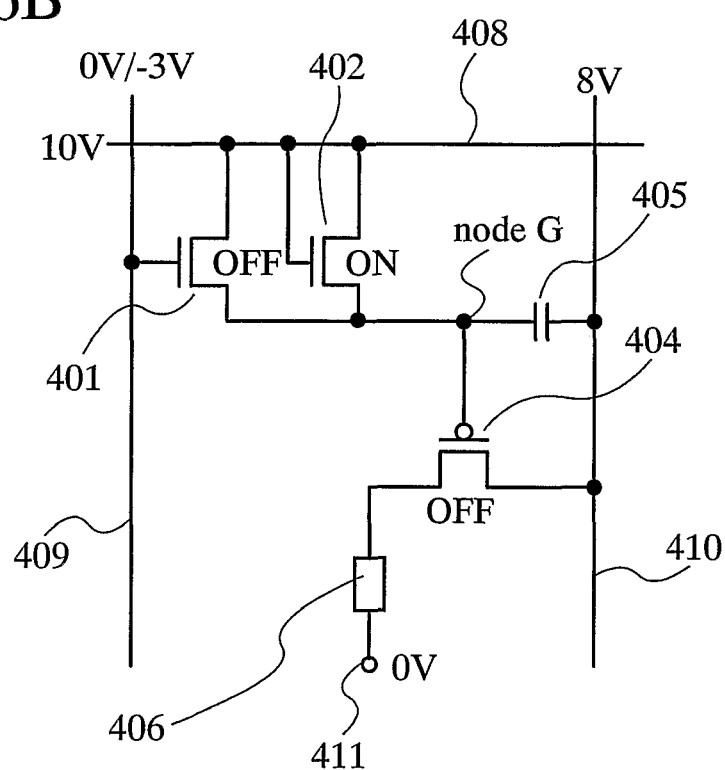

FIG. 6B shows potentials of wires and turning on or off of the transistors in the reset period in the pixel structure shown in FIG. 5. In order to explain the driving, a High potential of the data line 409 is set to be 0 V, a Low potential thereof is set to be −3 V, a High potential of the scan line 408 is set to be 10 V, a Low potential 1 thereof is set to be 0 V, a Low potential 2 thereof is set to be −3 V, a potential of the current supply line 410 is set to be 8 V, and a potential of the counter electrode 411 of the light-emitting element 406 is set to be 0 V. These specific potentials of the respective wires are just examples and the present invention is not limited to these as long as the transistors can be turned on or off by the potentials of these wires.

First, in the reset period, a selection pulse is outputted to the scan line 408 so that the potential of the scan line 408 changes from 0 V to 10 V, whereby the reset transistor 402 is turned on. If the absolute values of the thresholds of the transistors at this time are both 1 V, the node G has a potential of 9 V because the potential decreases from the potential of the scan line 408 by the threshold of the reset transistor 402. Since the current supply line 410 has a potential of 10 V, the driver transistor 404 is turned off.

In this reset period, the selection transistor 401 is turned on depending on the change of the potential of the data line 409. For example, if the node D has a potential of 0 V before the reset period and the data line has a potential of 3 V, the selection transistor 401 is turned on. However, when the input of the potential from the reset transistor is dominant in the node D in the reset period, resulting in that the node D has a higher potential than the gate potential of the selection transistor 401, the selection transistor 401 is turned off. Therefore, even if the potential of the data line 409 changes, the potential of a gate terminal of the driver transistor 404 does not change.

Figure 7A:
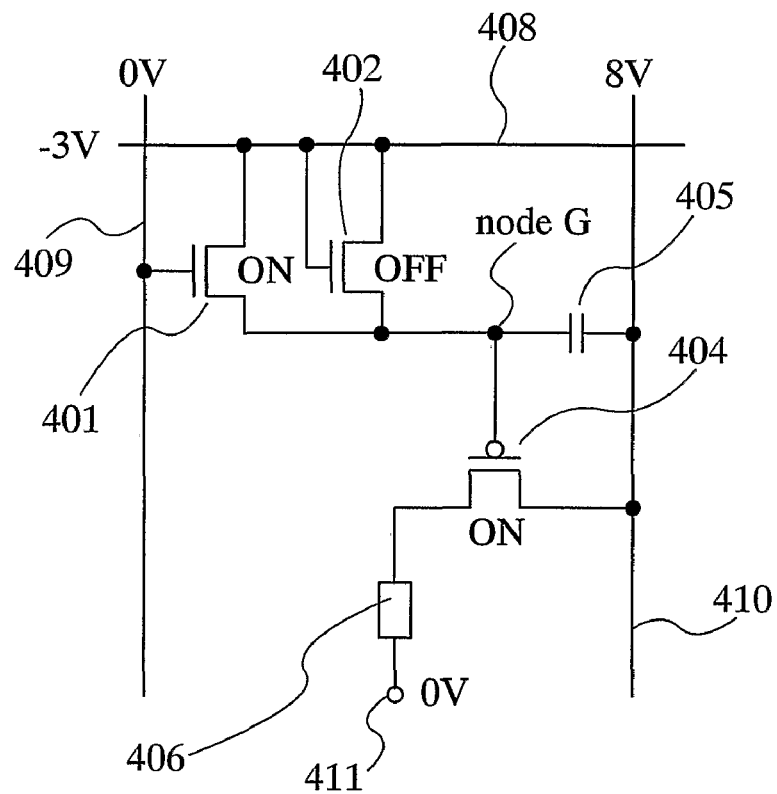
FIGS. 7A and 7B show one mode of Embodiment Mode 3.
Figure 7B:
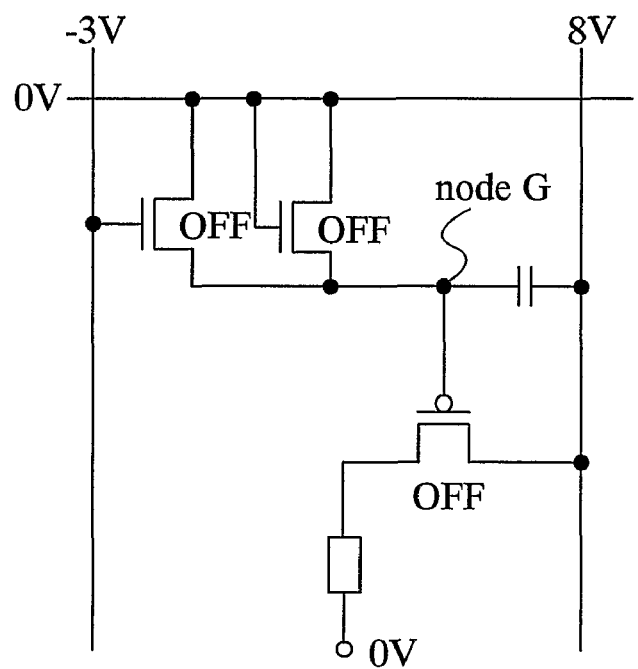

FIGS. 7A and 7B show potentials of the wires and turning on or off of the transistors in the case of selecting a light-emission state or a non-light-emission state of the light-emitting element in the selection period in the pixel structure of FIG. 5. In the selection period, the scan line 408 has a potential of −3 V.

At this time, if a potential of 0 V as a light-emission signal is inputted to the data line 409, the selection transistor 401 is turned on as shown in FIG. 7A and the node G has a potential of −3 V, which is the same as the potential of the scan line 408, so that the driver transistor 404 is turned on. Thus, current is fed from the current supply line 410 to the counter electrode 411 of the light-emitting element 406, whereby the light-emitting element 406 emits light.

When a potential of −3 V as a non-light-emission signal is inputted to the data line 409, the selection transistor 401 remains off as shown in FIG. 7B. Therefore, the potential of the node G remains 9 V and the driver transistor 404 also remains off.

Subsequently, the light-emission period starts, and the scan line 408 has a potential of 0 V. In the selection period, if the node G has a potential of 9 V, the selection transistor 401 remains off and the potential of the node G (9 V) is held in the holding capacitor 405. In the case where the node G has a potential of −3 V in the selection period, if the data line 409 has a High potential of 0 V even only once in the light-emission period, the selection transistor 401 is turned on. At this time, if the threshold voltage of the selection transistor 401 is 1 V, the node G has a potential of −1 V because the potential decreases from the potential of the scan line 408 (0 V) by the threshold of the selection transistor 401. However, the driver transistor 404 remains on.

At this time, Vgs (voltage between a gate electrode and a source electrode) in the case where the driver transistor 404 in each pixel is turned on is −7 V or −11 V depending on the potential of the data line 409 in the light-emission period. However, Vgs does not affect the luminance of the light-emitting element 406 that much because the light-emitting element 406 is driven in a linear region in either case.

This embodiment mode can be freely combined with other embodiment modes and embodiments.

Embodiment 1

Figure 8:
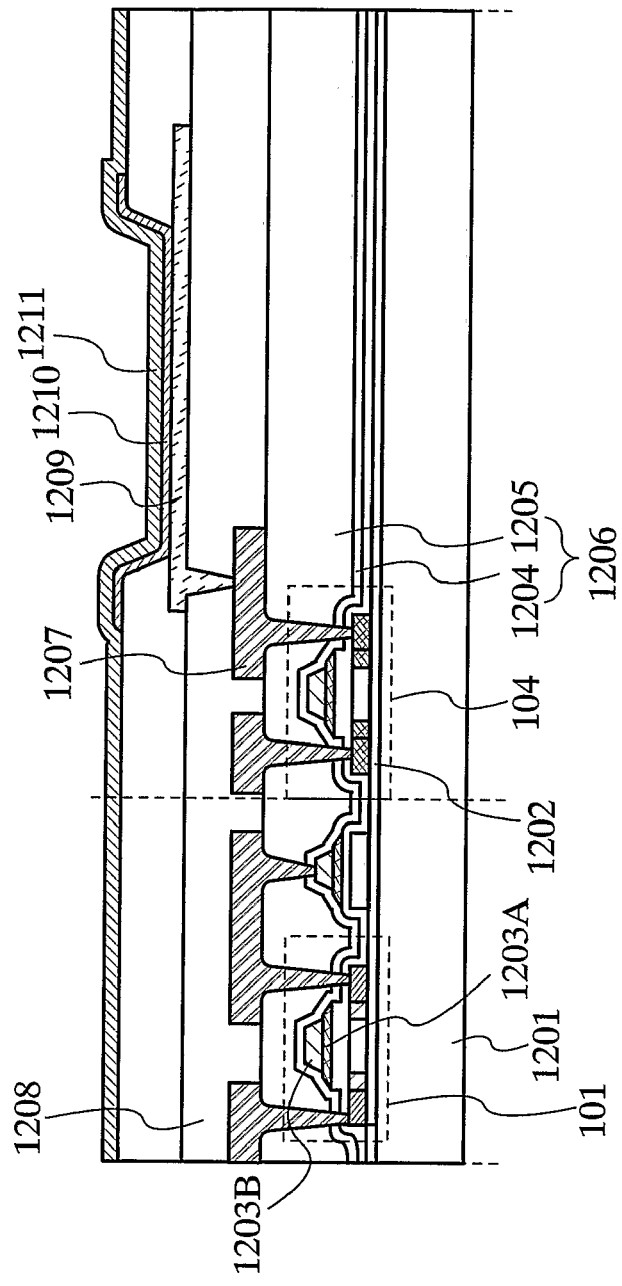
FIG. 8 is a cross-sectional view of Embodiment 1.

Embodiment 1 will describe a cross-sectional structure of a light-emitting device equipped with a semiconductor device of the present invention with reference to the drawings. Here, a cross section of a multilayer structure of a light-emitting device including a selection transistor 101, a driver transistor 104, and a light-emitting element is described with reference to FIG. 8.

As a substrate 1201 (a first substrate) having an insulating surface, a glass substrate, a quartz substrate, a stainless steel substrate, or the like can be used. A substrate formed with a flexible synthetic resin such as acrylic or plastic typified by polyethylene terephthalate (PET), polyethylene naphthalate (PEN), or the like can also be used as long as the substrate can resist treatment temperature in the manufacturing process.

Over the substrate 1201, a base film 1202 is formed first. The base film 1202 can be formed by using an insulating film such as a silicon oxide film, a silicon nitride film, or a silicon nitride oxide film. Next, an amorphous semiconductor film is formed over the base film 1202. The thickness of the amorphous semiconductor film ranges from 25 to 100 nm. Not only silicon but also silicon germanium can be used as the material of the amorphous semiconductor film. Subsequently, the amorphous semiconductor film is crystallized as necessary, thereby forming a crystalline semiconductor film. As the crystallization method, a heating furnace, laser irradiation, irradiation with light emitted from a lamp, or a combination thereof can be used. For example, a metal element is added to the amorphous semiconductor film and a heat treatment is conducted using a heating furnace to form the crystalline semiconductor film. Adding a metal element in this way is preferable because the crystallization can be carried out at low temperature.

Since a thin film transistor (TFT) formed with a crystalline semiconductor has higher electric field effect mobility and larger ON current than a TFT formed with an amorphous semiconductor, the TFT formed with a crystalline semiconductor is more suitable for a semiconductor device.

Next, etching is carried out to shape the crystalline semiconductor film into a predetermined form. Then, an insulating film serving as a gate insulating film is formed. The insulating film is formed in thickness from 10 to 150 nm so as to cover the semiconductor film. For example, a silicon oxynitride film, a silicon oxide film, or the like can be formed in a single layer or multilayer structure.

Next, a conductive film serving as a gate electrode is formed over the crystalline semiconductor film with the gate insulating film interposed therebetween. The gate electrode may have a single layer or multilayer structure, and here the gate electrode is formed by stacking plural conductive films. Conductive films 1203A and 1203B are formed with an element selected from Ta, W, Ti, Mo, Al, and Cu, or an alloy or compound material containing any one of the above elements as its main component. In this embodiment, the conductive film 1203A is formed using a tantalum nitride film with a thickness of 10 to 50 nm and the conductive film 1203B is formed using a tungsten film with a thickness of 200 to 400 nm.

Next, an impurity element is added to the crystalline semiconductor film by using the gate electrode as a mask, thereby forming an impurity region. At this time, a low-concentration impurity region may be formed in addition to a high-concentration impurity region. The low-concentration impurity region is referred to as an LDD (Lightly Doped Drain) region.

Next, insulating films 1204 and 1205 serving as an interlayer insulating film 1206 are formed. The insulating film 1204 is preferably formed by using an insulating film containing nitrogen, and here a 100-nm-thick silicon nitride film is formed by a plasma CVD method. The insulating film 1205 is preferably formed with an organic material or an inorganic material. As the organic material, polyimide, acrylic, polyamide, polyimide-amide, benzocyclobutene, or siloxane can be used. Siloxane has a skeletal structure with a bond of silicon (Si) and oxygen (O). As a substituent, an organic group containing at least hydrogen (such as an alkyl group or aromatic hydrocarbon) is used. As a substituent, a fluoro group or a fluoro group and an organic group containing at least hydrogen may be used. As the inorganic material, an insulating film containing oxygen or nitrogen, such as a silicon oxide ($SiO_x$) film, a silicon nitride ($SiN_x$) film, a silicon oxynitride ($SiO_xN_y$) (x>y, x and y are natural numbers) film, or a silicon nitride oxide ($SiN_xO_y$) (x<y, x and y are natural numbers) film can be used. It is noted that a film containing an organic material has favorable flatness whereas the organic material absorbs moisture and oxygen. In order to prevent the absorption of moisture and oxygen, an insulating film containing an inorganic material is preferably formed over the insulating film containing an organic material.

Next, after forming a contact hole in an interlayer insulating film 1206, a conductive film 1207 serving as a source wire and a drain wire of a transistor is formed. The conductive film 1207 can be formed with an element selected from aluminum (Al), titanium (Ti), molybdenum (Mo), tungsten (W), and silicon (Si), or alloy containing any of these elements. In this embodiment, the conductive film 1207 is formed with a multilayer film including a titanium film, a titanium nitride film, a titanium-aluminum alloy film, and another titanium film.

Next, an insulating film 1208 is formed so as to cover the conductive film 1207. The insulating film 1208 can be formed with the material mentioned as the material of the interlayer insulating film 1206. Next, a pixel electrode (also referred to as a first electrode) 1209 is formed in an opening portion provided in the insulating film 1208. In the opening portion, in order to improve step coverage of the pixel electrode 1209, an edge surface of the opening portion preferably has a round shape so as to have a plurality of radii of curvature.

The pixel electrode 1209 is preferably formed with a conductive material such as metal, alloy, an electrically conductive compound, a mixture thereof, or the like, each having a high work function (a work function of 4.0 eV or higher). As a specific example of the conductive material, indium oxide containing tungsten oxide (IWO), indium zinc oxide containing tungsten oxide (IWZO), indium oxide containing titanium oxide (ITiO), indium tin oxide containing titanium oxide (ITTiO), or the like can be given. Needless to say, indium tin oxide (ITO), indium zinc oxide (IZO), indium tin oxide with silicon oxide added (ITSO), or the like can also be used.

The composition ratio of the conductive material is as follows. The composition ratio of indium oxide containing tungsten oxide may be tungsten oxide:indium oxide=1.0 wt %:99.0 wt %. The composition ratio of indium zinc oxide containing tungsten oxide may be tungsten oxide:zinc oxide:indium oxide=1.0 wt %:0.5 wt %:98.5 wt %. The composition ratio of indium oxide containing titanium oxide may be titanium oxide:indium oxide=1.0 to 5.0 wt %:99.0 to 95.0 wt %. The composition ratio of indium tin oxide (ITO) may be tin oxide: indium oxide=10.0 wt %:90.0 wt %. The composition ratio of indium zinc oxide (IZO) may be zinc oxide:indium oxide=10.7 wt %:89.3 wt %. The composition ratio of indium tin oxide containing titanium oxide may be titanium oxide:tin oxide:indium oxide=5.0 wt %:10.0 wt %:85.0 wt %. These composition ratios are just examples, and the composition ratio may be appropriately determined.

Next, an electroluminescent layer 1210 is formed by an evaporation method or an ink jet method. The electroluminescent layer 1210 is formed with an organic material or an inorganic material by appropriately combining an electron-injecting layer (EIL), an electron-transporting layer (ETL), a light-emitting layer (EML), a hole-transporting layer (HTL), a hole-injecting layer (HIL), and the like. It is not always necessary that the boundary between the respective layers is clear. In some cases, the materials of the layers are partially mixed, resulting in that the interface is unclear.

The electroluminescent layer is preferably formed with plural layers having different functions, such as a hole-injecting/transporting layer, a light-emitting layer, an electron-injecting/transporting layer, and the like.

The hole-injecting/transporting layer is preferably formed with an organic compound material having a hole-transporting property and an inorganic compound material having an electron-receiving property with respect to the organic compound material. This structure generates a large number of hole carriers in an organic compound, which originally has almost no inherent carriers, to provide an excellent hole-injecting/transporting property. Accordingly, the driving voltage can be lower than conventional driving voltage. Further, since the hole-injecting/transporting layer can be made thick without raising the driving voltage, short circuit of the light-emitting element due to dust and the like can be reduced.

As an organic compound having a hole-transporting property, for example, copper phthalocyanine (abbreviated to CuPc), vanadyl phthalocyanine (abbreviated to VOPc), 4,4',4''-tris(N,N-diphenylamino)triphenylamine (abbreviated to TDATA), 4,4',4''-tris[N-(3-methylphenyl)-N-phenylamino]triphenylamine (abbreviated to MTDATA), 1,3,5-tris[N,N-di(m-tolyl)amino]benzene (abbreviated to m-MTDAB), N,N'-diphenyl-N,N'-bis(3-methylphenyl)-1,1'-biphenyl-4,4'-diamine (abbreviated to TPD), 4,4'-bis[N-(1-naphthyl)-N-phenylamino]biphenyl (abbreviated to NPB), 4,4'-bis{N-[4-di(m-tolyl)amino]phenyl-N-phenylamino}biphenyl (abbreviated to DNTPD), 4,4',4''-tris(N-carbazolyl)triphenylamine (abbreviated to TCTA), or the like is given as an example. However, the organic compound is not limited to these.

As the inorganic compound material having an electron-receiving property, titanium oxide, zirconium oxide, vanadium oxide, molybdenum oxide, tungsten oxide, rhenium oxide, ruthenium oxide, zinc oxide, or the like is given. In particular, vanadium oxide, molybdenum oxide, tungsten oxide, and rhenium oxide are preferable because these can be formed by vacuum evaporation and easily treated.

An electron-injecting/transporting layer is formed with an organic compound material having an electron-transporting property. Specifically, tris(8-quinolinolato) aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), bis(2-methyl-8-quinolinolato)(4-phenylphenolato)aluminum (abbreviated to BAlq), bis[2-(2'-hydroxyphenyl)benzoxazolato]zinc (abbreviated to $Zn(BOX)_2$), bis[2-(2'-hydroxyphenyl)benzothiazolato]zinc (abbreviated to $Zn(BTZ)_2$), bathophenanthroline (abbreviated to BPhen), bathocuproin (abbreviated to BCP), 2-(4-biphenylyl)-5-(4-tert-butylphenyl)-1,3,4-oxadiazole (abbreviated to PBD), 1,3-bis[5-(4-tert-butylphenyl)-1,3,4-oxadiazole-2-yl]benzene (abbreviated to OXD-7), 2,2',2''-(1,3,5-benzenetriyl)-tris(1-phenyl-1H-benzoimidazole) (abbreviated to TPBI), 3-(4-biphenylyl)-4-phenyl-5-(4-tert-butylphenyl)-1,2,4-triazole (abbreviated to TAZ), 3-(4-biphenylyl)-4-(4-ethylphenyl)-5-(4-tert-butylphenyl)-1,2,4-triazole (abbreviated to p-EtTAZ), or the like is given. However, the organic compound material is not limited to these.

As the light-emitting layer, the following compound can be given as an example: 9,10-di(2-naphthyl)anthracene (abbreviated to DNA), 9,10-di(2-naphthyl)-2-tert-butylanthracene (abbreviated to t-BuDNA), 4,4'-bis(2,2-diphenylvinyl)biphenyl (abbreviated to DPVBi), coumarin 30, coumarin 6, coumarin 545, coumarin 545T, perylene, rubrene, periflanthene, 2,5,8,11-tetra(tert-butyl)perylene (abbreviated to TBP), 9,10-diphenylanthracene (abbreviated to DPA), 5,12-diphenyltetracene, 4-(dicyanomethylene)-2-methyl-[p-(dimethylamino)styryl]-4H-pyran (abbreviated to DCM1), 4-(dicyanomethylene)-2-methyl-6-[2-(joulolidine-9-yl)ethenyl]-4H-pyran (abbreviated to DCM2), 4-(dicyanomethylene)-2,6-bis[p-(dimethylamino)styryl]-4H-pyran (abbreviated to BisDCM), or the like. In addition, compounds capable of producing phosphorescence such as bis[2-(4',6'-difluorophenyl)pyridinato-N,$C^{2'}$]iridium(picolinate) (abbreviated to FIrpic), bis{2-[3',5'-bis(trifluoromethyl)phenyl]pyridinato-N,$C^{2'}$}iridium(picolinate) (abbreviated to $Ir(CF_3ppy)_2(pic)$), tris(2-phenylpyridinato-N,$C^{2'}$)iridium (abbreviated to $Ir(ppy)_3$), bis(2-phenylpyridinato-N, $C^{2'}$)iridium (acetylacetonate) (abbreviated to $Ir(ppy)_2(acac)$), bis[2-(2'-thienyl)pyridinato-N,$C^{3'}$]iridium(acetylacetonate) (abbreviated to $Ir(thp)_2(acac)$), bis(2-phenylquinolinato-N, $C^{2'}$)iridium(acetylacetonate) (abbreviated to $Ir(pq)_2(acac)$), or bis [2-(2'-benzothienyl)pyridinato-N,$C^{3'}$]iridium(acetylacetonate) (abbreviated to $Ir(btp)_2(acac)$) can also be used.

The light-emitting layer may use a singlet excited light-emitting material and a triplet excited material including a metal complex. For example, among a red light-emitting pixel, a green light-emitting pixel, and a blue light-emitting pixel, the red light-emitting pixel whose luminance half-reduced period is relatively short is formed with a triplet-excited light-emitting material and the others are formed with singlet-excited light-emitting materials. Because of high luminous efficiency, the power consumption of a triplet-excited light-emitting material is less than that of a singlet-excited light-emitting material to obtain the same luminance. In other words, if the red light-emitting pixel is formed with a triplet-excited light-emitting material, the reliability thereof can be improved because the amount of current to be fed to the light-emitting element of the red light-emitting pixel is small. In order to reduce the power consumption, the red light-emitting pixel and the green light-emitting pixel may be formed with triplet-excited light-emitting materials and the blue light-emitting pixel may be formed with a singlet-excited light-emitting material. By forming the green light-emitting element, which has high visibility to human eyes, with a triplet-excited light-emitting material, further reduction in the power consumption can be achieved.

The light-emitting layer may have a structure for displaying in colors by forming a light-emitting layer with a different light emission wavelength band for each pixel. Typically, light-emitting layers each corresponding to each color of R (red), G (green), and B (blue) are formed. Even in this case, by having a structure in which a filter for passing light with the light emission wavelength band is provided on a light emission side of the pixel, color purity can be increased and reflection (glare) of the pixel portion can be prevented. By providing the filter, it is possible to omit a circular polarizing plate and the like which have been conventionally required and to avoid the loss of light emitted from the light-emitting layer. Moreover, the change of color tone which occurs when the pixel portion (display screen) is viewed obliquely can be decreased.

In addition, as an electroluminescent material applicable to the light-emitting layer a high molecular weight material such as a polyparaphenylenevinylene-based material, a polyparaphenylene-based material, a polythiophene-based material, a polyfluorene-based material, or the like is given.

In any way, the layer structure of the electroluminescent layer can be modified. Within the scope for achieving the function as the light-emitting element, such modification is allowable that predetermined hole or electron injecting/transporting layer and light-emitting layer are replaced by electrode layers having the same purposes or a light-emitting material is provided by being diffused.

Moreover, a color filter (colored layer) may be formed over a sealing substrate. The color filter (colored layer) can be formed by an evaporation method or a droplet discharging method. By using the color filter (colored layer), high-definition display can be carried out because the color filter (colored layer) can compensate a broad peak so as to be a sharp peak in a light-emission spectrum in each color of RGB.

Further, full-color display can be achieved by forming a material expressing light emission of a single color and combining the material with a color filter or a color conversion layer. The color filter (colored layer) or the color conversion layer may be formed over, for example, a second substrate (sealing substrate) and pasted to the substrate 1201.

Then, a counter electrode (also referred to as a second electrode) 1211 is formed by a sputtering method or an evaporation method. One of the pixel electrode 1209 and the counter electrode 1211 serves as an anode while the other serves as a cathode.

As a cathode material, it is preferable to use metal, alloy, an electrically conductive compound, a mixture thereof, or the like each having a low work function (a work function of 3.8 eV or lower). As a specific example of the cathode material, an element belonging to Group 1 or 2 in the periodic table, i.e., alkali metal such as Li or Cs, alkaline earth metal such as Mg, Ca, or Sr, alloy containing these metal such as Mg:Ag or Al:Li, a compound containing these metal such as LiF, CsF, or $CaF_2$, or transition metal containing rare-earth metal can be used. However, since the cathode needs to have a light-transmitting property, these metal or alloy containing the metal is formed extremely thin and another metal such as ITO (including alloy) is stacked thereover.

After that, a protective film including a silicon nitride film or a DLC (Diamond-like Carbon) film may be provided so as to cover the counter electrode 1211. Through the above steps, a light-emitting device of the present invention is completed.

This embodiment can be freely combined with the above Embodiment Modes and another Embodiment.

Embodiment 2

Figure 9:
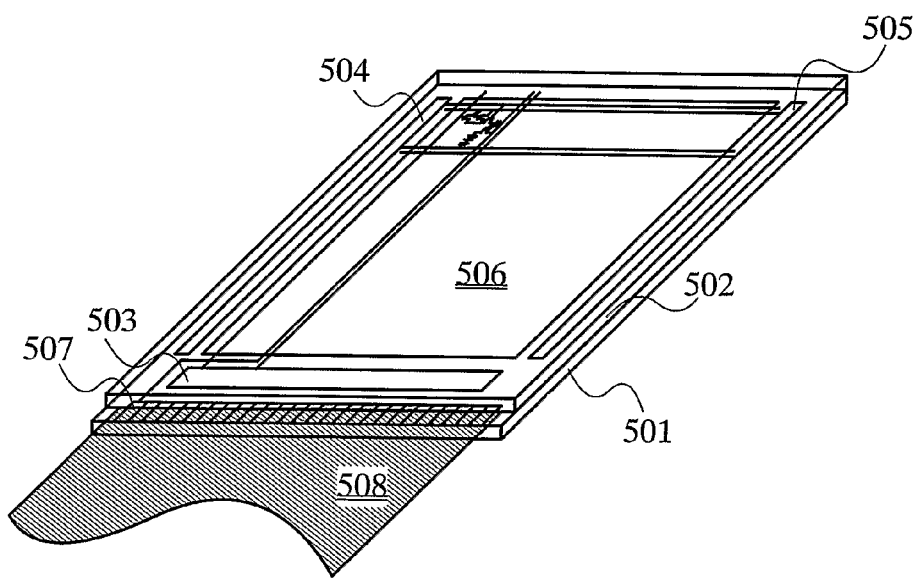
FIG. 9 is a perspective view of Embodiment 2.

Embodiment 2 will describe an example of an active matrix display using a pixel structure of the present invention, with reference to FIG. 9.

The active matrix display includes a substrate 501 over which a transistor and a wire are formed, an FPC 508 for connecting the wire with the outside, a light-emitting element, and a counter substrate 502 for sealing the light-emitting element.

A display portion 506 including a plurality of pixels arranged in matrix, a data line driver circuit 503, a scan line driver circuit A 504, a scan line driver circuit B 505, and an FPC connection portion 507 to be connected to the FPC 508 for which various power sources and signals are inputted are provided over the substrate 501.

The data line driver circuit 503 has circuits such as a shift register, a latch, a level shifter, and a buffer, and data signal are outputted to a data line of each column. Each of the scan line driver circuit A 504 and the scan line driver circuit B 505 has circuits such as a shift register, a level shifter, and a buffer. The scan line driver circuit A 504 outputs a sequential selection pulse to a second scan line of each row while the scan line driver circuit B 505 outputs a sequential selection pulse to a first scan line of each row.

Whether the light-emitting element emits light or not is controlled in accordance with a data signal written in each pixel at such timing that selection pulses are outputted from the scan line driver circuit A 504 and the scan line driver circuit B 505.

In addition to the above driver circuit, circuits such as a CPU and a controller may be integrally formed over the substrate 501. This makes it possible to decrease the number of external circuits (ICs) to be connected and further reduce the weight and thickness, which is particularly effective for mobile terminals and the like.

In this specification, as shown in FIG. 9, a panel to which the steps up to attaching the FPC have been carried out and which uses an EL element for the light-emitting element is referred to as an EL module.

This embodiment can be freely combined with the above embodiment Modes and embodiments.

Embodiment 3

Embodiment 3 will describe an example in which the potential of a current supply line is compensated to suppress an effect due to fluctuation of a current value of a light-emitting element caused by change in ambient temperature and change over time.

A light-emitting element using an organic compound in a light-emitting layer has such a property that its resistance value (internal resistance value) is easier to change than a light-emitting element using an inorganic material, depending on the ambient temperature. Specifically, when the room temperature is set at a normal temperature, if the temperature is higher than normal, the resistance value decreases, while if the temperature is lower than normal, the resistance value increases. Therefore, if the temperature increases, in the case of applying the same voltage, the current value increases, causing the luminance to exceed the desired luminance. If the temperature decreases, in the case of applying the same voltage, the current value decreases, causing the luminance to fall below the desired luminance. The light-emitting element has such a property that the current value decreases over time. Specifically, when a light-emission period and a non-light-emission period are accumulated, the resistance value increases with the deterioration of the light-emitting element. Thus, if the light-emission period and the non-light-emission period are accumulated, in the case of applying the same voltage, the current value decreases, causing the luminance to fall below the desired luminance.

Because of the above-mentioned property of the light-emitting element, the luminance varies because of the change in the ambient temperature or the change over time. In this embodiment, by using the potential of the current supply line of the present invention for compensation, it is possible to suppress an effect due to fluctuation in the current value of the light-emitting element caused by the change in the ambient temperature and the change over time. This embodiment is particularly effective when the light-emitting element is an organic EL element whose resistance value easily fluctuates by the change in the ambient temperature and the change over time.

Figure 10:
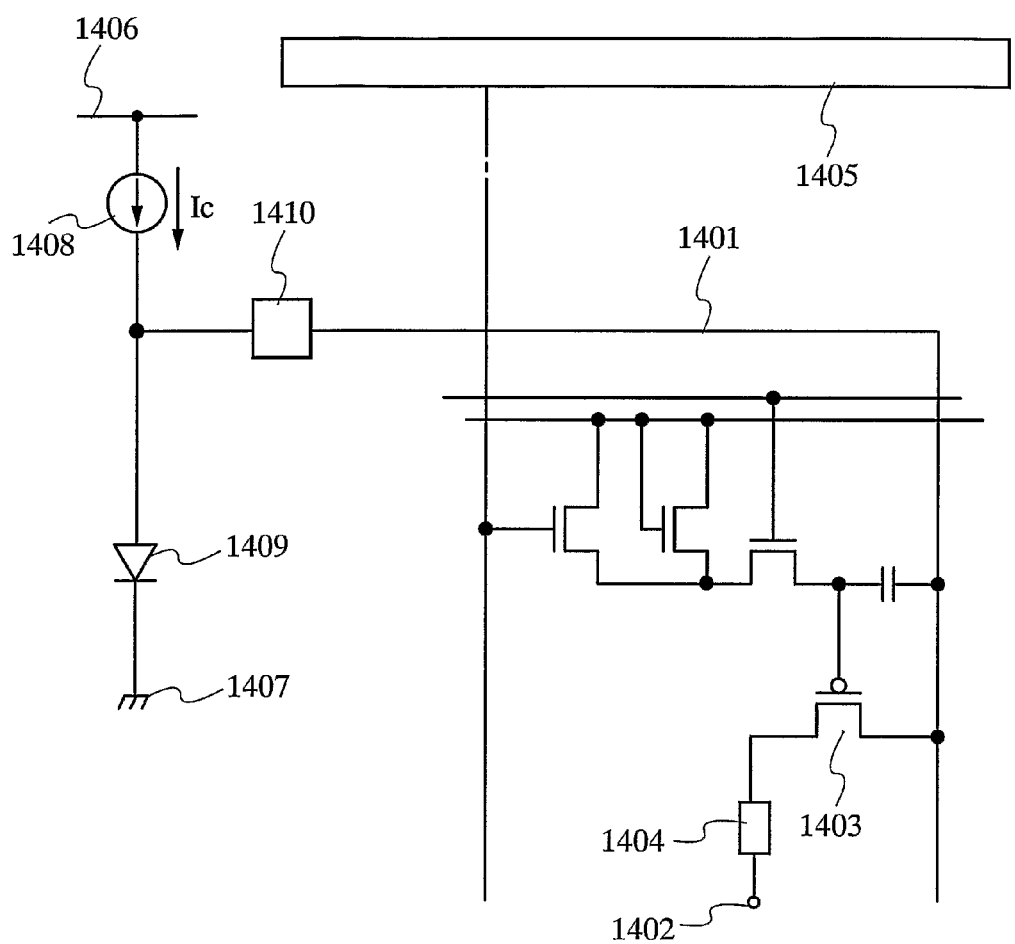
FIG. 10 is a circuit diagram of Embodiment 3.

FIG. 10 shows a circuit structure. In a pixel, a semiconductor device shown in FIG. 1 is provided. The description on the same portion as that in FIG. 1 is omitted. In FIG. 10, a current supply line 1401 and a counter electrode 1402 are connected to each other through a driver transistor 1403 and a light-emitting element 1404 as shown in FIG. 1. Then, current flows from the current supply line 1401 to the counter electrode 1402. The light-emitting element 1404 emits light in accordance with the amount of current flowing from the current supply line 1401 to the counter electrode 1402. A reference numeral 1405 denotes a data line driver circuit.

In the case of such a pixel structure, if the potentials of the current supply line 1401 and the counter electrode 1402 are fixed and current keeps flowing to the light-emitting element 1404, the characteristic of the light-emitting element 1404 deteriorates. Moreover, the characteristic of the light-emitting element 1404 changes according to the ambient temperature.

Specifically, if current keeps flowing to the light-emitting element 1404, the voltage-current characteristic begins to shift. In other words, the resistance value of the light-emitting element 1404 increases, so that the amount of flowing current gets smaller even though the same amount of voltage is applied. Moreover, although the same amount of current is fed, the luminous efficiency decreases to lower the luminance. As for the temperature characteristic, if the temperature decreases, the voltage-current characteristic shifts, which raises the resistance value of the light-emitting element 1404.

Therefore, the above-mentioned deterioration and effect by the fluctuation are compensated by using a monitor circuit. In this embodiment, by adjusting the potential of the current supply line 1401, the deterioration and the fluctuation by the temperature of the light-emitting element 1404 are compensated.

Here, a structure of a monitor circuit is described. A first monitor power source line 1406 and a second monitor power source line 1407 are connected to each other through a monitor current source 1408 and a monitor light-emitting element 1409. To a connection point of the monitor light-emitting element 1409 and the monitor current source 1408, an input terminal of a sampling circuit 1410 for outputting the potential of the monitor light-emitting element 1409 is connected. To an output terminal of the sampling circuit 1410, the current supply line 1401 is connected. Therefore, the potential of the current supply line 1401 is controlled by the output of the sampling circuit 1410.

Next, operation of the monitor circuit is described. First, the monitor current source 1408 feeds current with the amount required to make the light-emitting element 1404 emit light with the largest number of grayscales. The current value at this time is Imax.

Then, at opposite ends of the monitor light-emitting element 1409, the voltage with the level necessary to feed current with the amount of Imax is applied. If the current-voltage characteristic of the monitor light-emitting element 1409 changes in accordance with the deterioration, the temperature, or the like, the voltage to be applied at the opposite ends of the monitor light-emitting element 1409 also changes to be optimum. Therefore, the effect of the fluctuation in the monitor light-emitting element 1409 (such as deterioration or the temperature change) can be compensated.

To an input terminal of the sampling circuit 1410, the voltage to be applied to the monitor light-emitting element 1409 is inputted. Therefore, the potential of the output terminal of the sampling circuit 1410, i.e., the potential of the current supply line 1410 is compensated by the monitor circuit, whereby the fluctuation of the light-emitting element 1404 by the deterioration or the temperature can be compensated.

The sampling circuit 1410 may be any kind of circuit as long as the voltage in accordance with the inputted current can be outputted. For example, a voltage follower circuit is also a kind of an amplifier circuit; however, the circuit is not limited to this. The circuit may be formed using any one of an operational amplifier, a bipolar transistor, and a MOS transistor or a combination of these.

The monitor light-emitting element 1409 is desirably formed over the same substrate, at the same time, and by the same manufacturing method as the light-emitting element 1404 of the pixel, because the compensation would be misaligned if the characteristic were different in the light-emitting element for the monitor and the light-emitting element to be arranged in the pixel.

Since the light-emitting element 1404 arranged in the pixel often has a period in which current does not flow, if current keeps flowing to the monitor light-emitting element 1409, the deterioration progresses in the monitor light-emitting element 1409 rather than in the light-emitting element 1404. Therefore, the potential to be outputted from the sampling circuit 1410 becomes an excessively compensated potential. Accordingly, the potential outputted from the sampling circuit 1410 may follow the actual degree of deterioration of the pixel. For example, if the lighting ratio of the whole screen is 30% on average, current may be fed to the monitor light-emitting element 1409 for the period corresponding to a luminance of 30%. At that time, the monitor light-emitting element 1409 has a period in which current does not flow; however, it is necessary to supply voltage constantly from the output terminal of the sampling circuit 1410. In order to achieve this, the input terminal of the sampling circuit 1410 may be provided with a capacitor element where the potential generated when current is fed to the monitor light-emitting element 1409 is held.

If the monitor circuit is operated in accordance with the largest number of grayscales, the excessively compensated potential is outputted. However, since burning-in at the pixel (variation in luminance due to the fluctuation in the degree of deterioration per pixel) becomes unnoticeable, it is desirable that the monitor circuit be operated in accordance with the largest number of grayscales.

In this embodiment, it is more preferable that the driver transistor 1403 be operated in a linear region. The driver transistor 1403 is operated approximately as a switch by being operated in a linear region. Therefore, it is possible to suppress the effect of the fluctuation in the characteristic by the deterioration, temperature, and the like of the driver transistor 1403. In the case of operating the driver transistor 1403 only in a linear region, whether current is fed to the light-emitting element 1404 or not is often controlled in a digital manner In this case, in order to increase the number of grayscales, it is preferable to combine a time grayscale method, an area grayscale method, and the like.

This embodiment can be freely combined with the above embodiment modes and embodiments.

Embodiment 4

As electronic appliances equipped with semiconductor devices of the present invention, a television receiving appliance, a camera such as a video camera or a digital camera, a goggle type display, a navigation system, a sound reproducing device (such as a car audio component), a computer, a game machine, a mobile information terminal (such as a mobile computer, a mobile phone, a mobile game machine, or an electronic book), an image reproducing device equipped with a recording medium (specifically, a device for reproducing a recording medium such as a digital versatile disk (DVD), which is equipped with a display for displaying the reproduced image), and the like are given. Specific examples of these electronic appliances are shown in FIG. 11, FIG. 12, FIGS. 13A and 13B, FIGS. 14A and 14B, FIG. 15, and FIGS. 16A to 16E.

Figure 11:
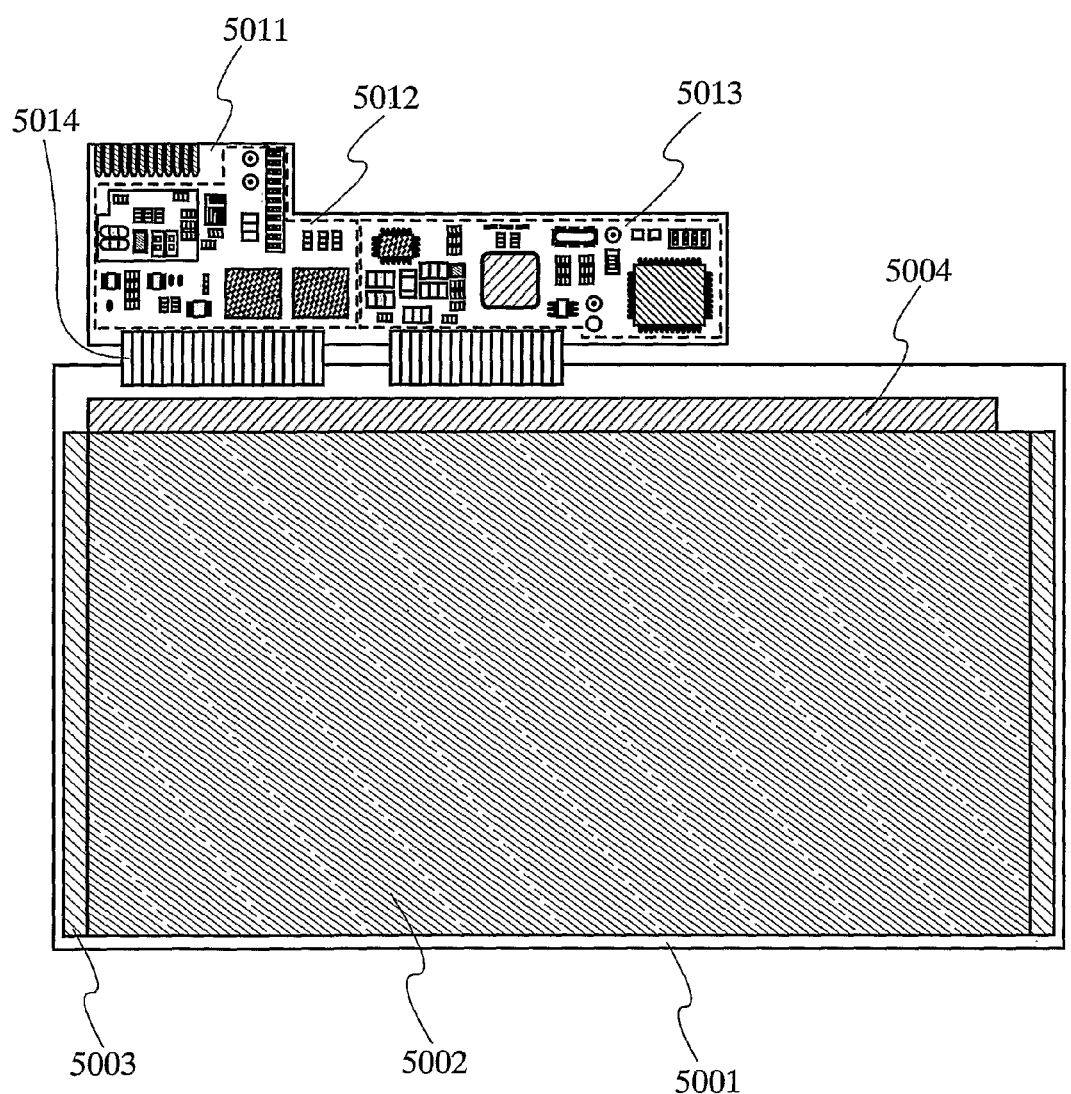
FIG. 11 shows an electronic appliance of Embodiment 4.

FIG. 11 shows an EL module in which a display panel 5001 and a circuit substrate 5011 are combined. Over the circuit substrate 5011, a control circuit 5012, a signal dividing circuit 5013, and the like are formed, and the display panel 5001 and the circuit substrate 5011 are connected to each other with a connection wire 5014.

This display panel 5001 is equipped with a pixel portion 5002 in which a plurality of pixels are provided, a scan line driver circuit 5003, and a data line driver circuit 5004 for supplying a video signal to the selected pixel. In the case of manufacturing an EL module, semiconductor devices constituting the pixels in the pixel portion 5002 may be manufactured by using the above embodiments. Further, control driver circuit portions such as the scan line driver circuit 5003 and the data line driver circuit 5004 can be manufactured by using TFTs formed by the above embodiments. Thus, an EL module television shown in FIG. 11 can be completed.

Figure 12:
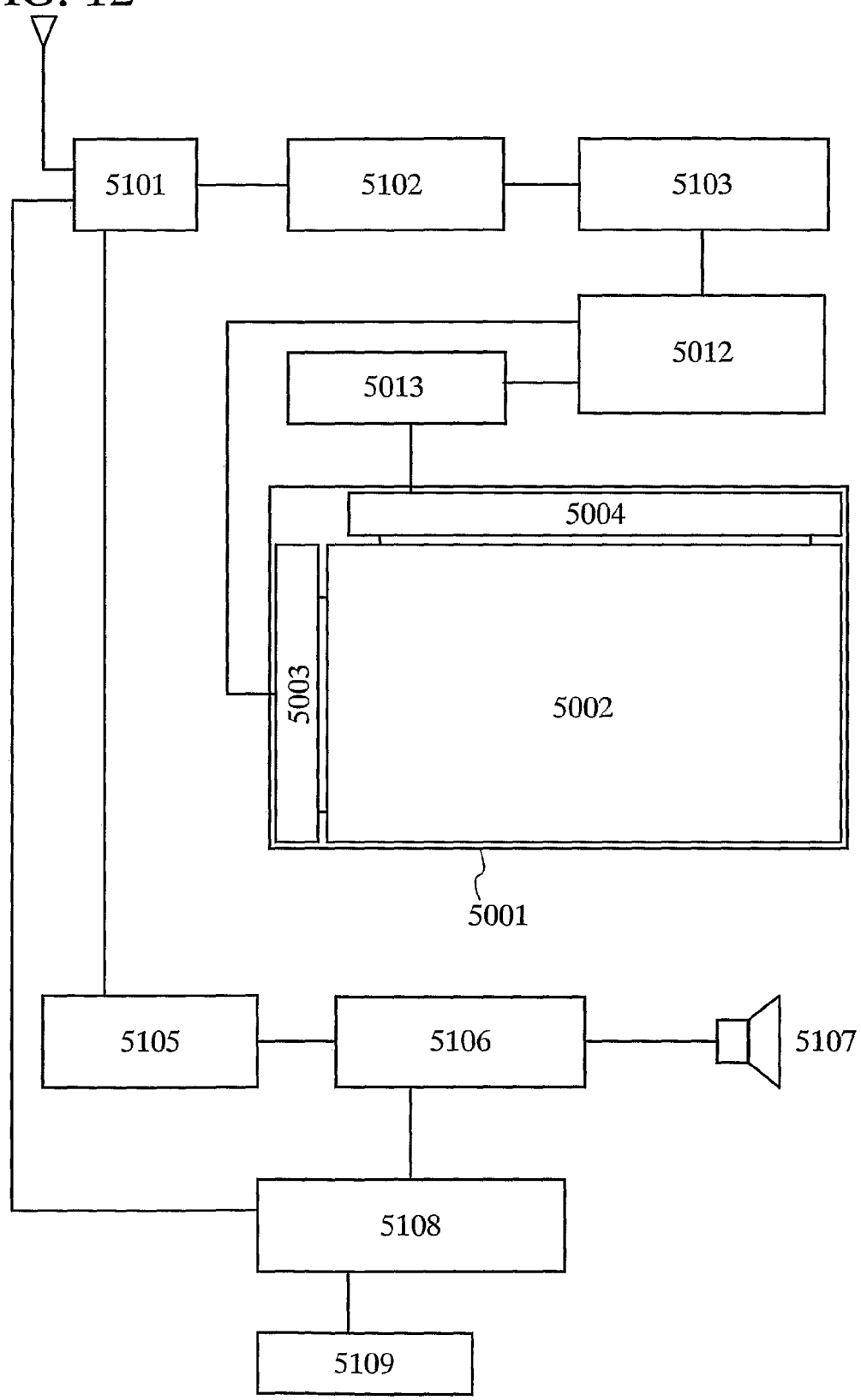
FIG. 12 shows an electronic appliance of Embodiment 4.

FIG. 12 is a block diagram showing a main constitution of an EL television receiving machine. A video signal and an audio signal are received with a tuner 5101. The video signal is processed by an image signal amplifying circuit 5102, an image signal processing circuit 5103 for converting a signal outputted from the image signal amplifying circuit 5102 into a color signal corresponding to red, green, or blue, and a control circuit 5012 for converting the image signal in accordance with an input specification of a driver IC. The control circuit 5012 outputs signals to a scan line side and a data line side, respectively. In the case of digital driving, a signal dividing circuit 5013 may be provided on the data line side, so that the inputted digital signal may be divided into m number of signals and supplied.

Among the signals received with the tuner 5101, an audio signal is sent to an audio signal amplifying circuit 5105 and outputted to a speaker 5107 through an audio signal processing circuit 5106. A control circuit 5108 receives control information such as a receiving station (receiving frequency) or volume from the input portion 5109 and sends a signal to the tuner 5101 or the audio signal processing circuit 5106.

Figure 13A:
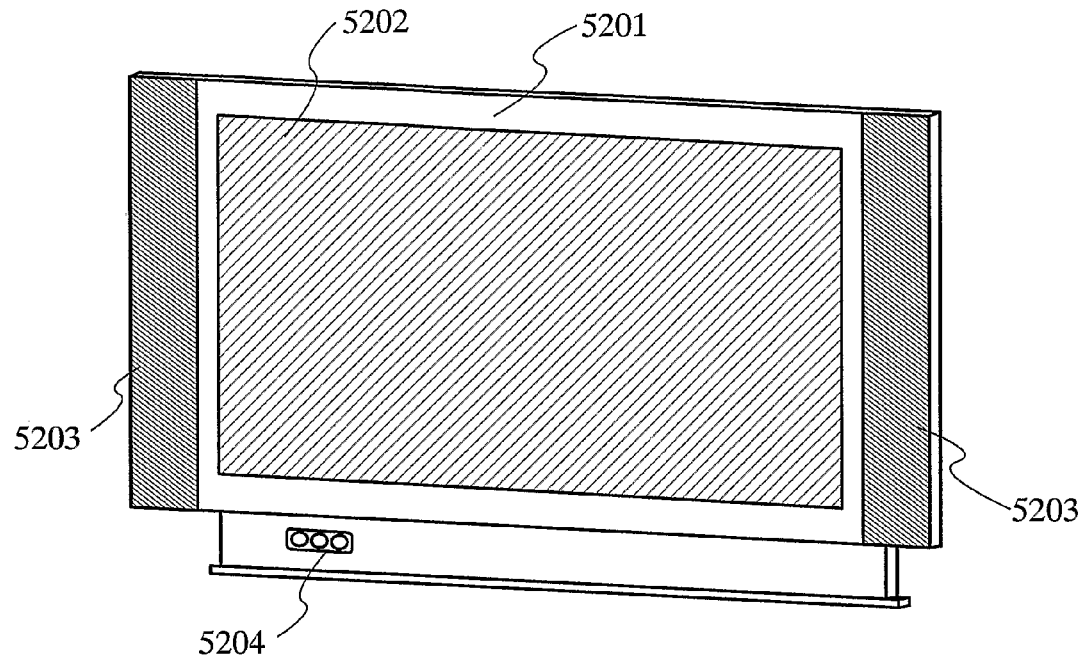
FIGS. 13A and 13B show electronic appliances of Embodiment 4.

As shown in FIG. 13A, a television receiving machine can be completed by incorporating an EL module in a housing 5201. With the EL module, a display screen 5202 is formed. Further, speakers 5203, an operation switch 5204, and the like are appropriately provided.

Figure 13B:
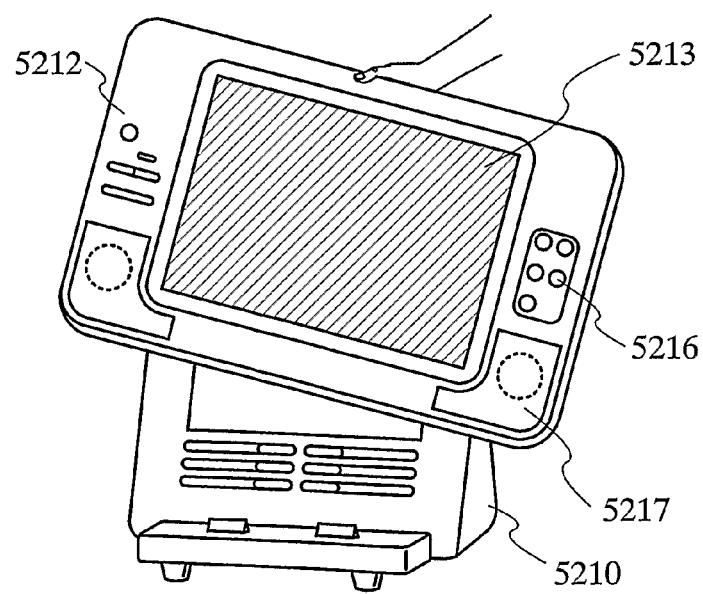

FIG. 13B shows a television receiving appliance of which only a display can be wirelessly carried. A housing 5212 incorporates a battery and a signal receiver, and a display portion 5213 and a speaker portion 5217 are driven with the battery. The battery can be repeatedly charged with a battery charger 5210. The battery charger 5210 can send and receive a video signal and can send the video signal to the signal receiver in the display. The housing 5212 is controlled by an operation key 5216. Since the appliance shown in FIG. 13B can send a signal from the housing 5212 to the battery charger 5210 by operating the operation key 5216, the appliance can also be referred to as a two-way video/audio communication device. Moreover, by operating the operation key 5216, a signal can be sent from the housing 5212 to the battery charger 5210 and the signal can be further sent from the battery charger 5210 to another electronic appliance, so that communication control of another electronic appliance is also possible. Therefore, it is also referred to as a general-purpose remote control device. The present invention can be applied to the display portion 5213.

By using the semiconductor device of the present invention in the television receiving appliance shown in FIG. 11, FIG. 12, and FIGS. 13A and 13B, it is possible to separately set the on/off potential to be applied to a gate electrode of a first transistor (driver transistor) and the potential of the amplitude of a data line in a pixel of a display portion. Therefore, the amplitude of the data line can be set to be small, whereby a semiconductor device consuming much less electric power can be provided. Accordingly, a product with the drastically suppressed power consumption can be provided to customers.

Needless to say, the present invention is not limited to the television receiving machine, and the present invention can be applied to various purposes, such as monitors for personal computers, large display media like information displaying boards at railway stations or airports, or advertisement display boards on streets.

Figure 14A:
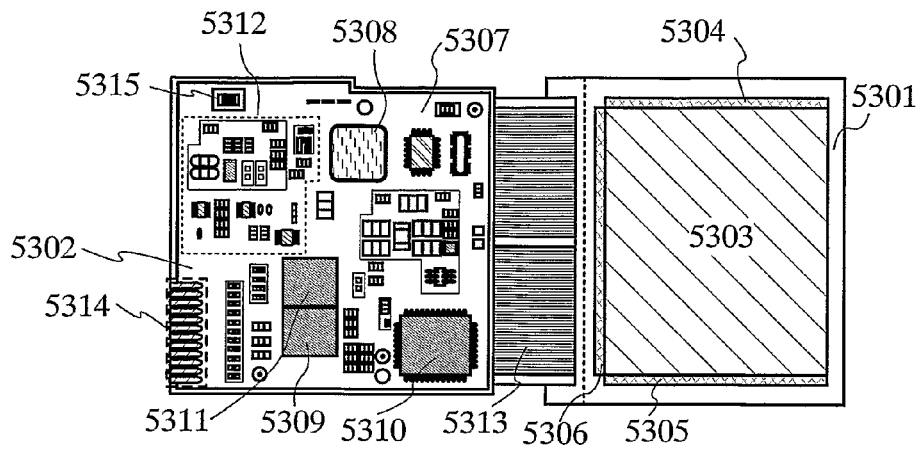
FIGS. 14A and 14B show an electronic appliance of Embodiment 4.

FIG. 14A shows a module in which a display panel 5301 and a printed wiring substrate 5302 are combined. The display panel 5301 is equipped with a pixel portion 5303 in which a plurality of pixels are provided, a first scan line driver circuit 5304, a second scan line driver circuit 5305, and a data line driver circuit 5306 for supplying a video signal to the selected pixel.

The printed wiring substrate 5302 is equipped with a controller 5307, a central processing unit (CPU) 5308, a memory 5309, a power source circuit 5310, an audio processing circuit 5311, a sending/receiving circuit 5312, and the like. The printed wiring substrate 5302 and the display panel 5301 are connected to each other by a flexible wiring substrate (FPC) 5313. The printed wiring substrate 5302 may be provided with a capacitor element, a buffer circuit, and the like so that noise on power source voltage and a signal, and a delay of the signal rise time can be prevented. Moreover, the controller 5307, the audio processing circuit 5311, the memory 5309, the CPU 5308, the power source circuit 5310, and the like can be mounted to the display panel 5301 by a COG (Chip On Glass) method. By the COG method, the scale of the printed wiring substrate 5302 can be reduced.

Various control signals are inputted/outputted through an interface (I/F) portion 5314 provided to the printed wiring substrate 5302. Moreover, an antenna port 5315 for sending/receiving a signal between the antenna and the printed wiring substrate 5302 is provided to the printed wiring substrate 5302.

Figure 14B:
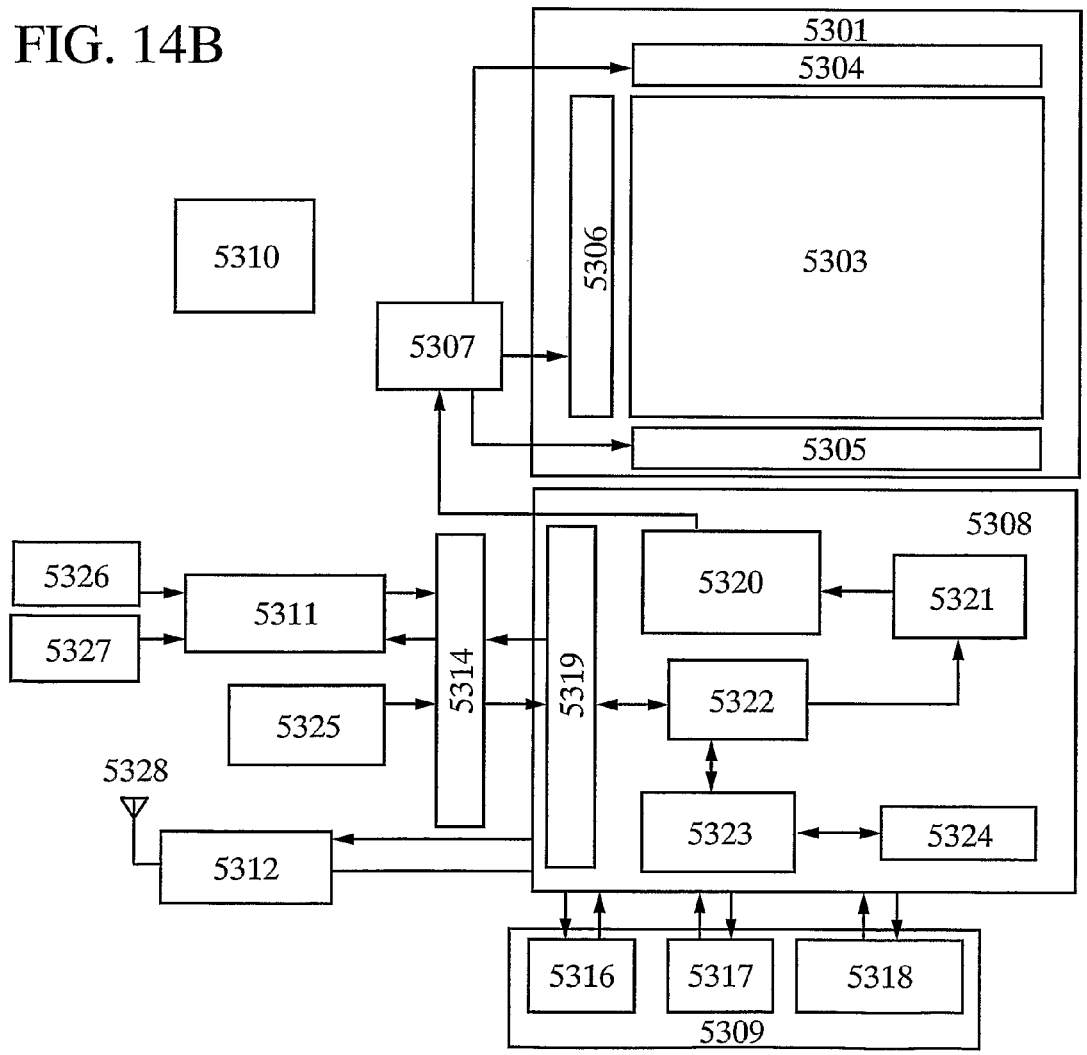

FIG. 14B is a block diagram showing a module shown in FIG. 14A. This module has a VRAM 5316, a DRAM 5317, a flash memory 5318, and the like as the memory 5309. The VRAM 5316 stores image data to be displayed on the panel, the DRAM 5317 stores image data or audio data, and the flash memory 5318 stores various programs.

The power source circuit 5310 supplies electric power for operating the display panel 5301, the controller 5307, the CPU 5308, the audio processing circuit 5311, the memory 5309, and the sending/receiving circuit 5312. The power source circuit 5310 is sometimes equipped with a current source depending on the specification of the panel.

The CPU 5308 has a control signal generating circuit 5320, a decoder 5321, a register 5322, an arithmetic circuit 5323, a RAM 5324, an interface (I/F) portion 5319 for the CPU 5308, and the like. Various signals inputted to the CPU 5308 through the interface portion 5319 are inputted to the arithmetic circuit 5323, the decoder 5321, and the like after being held in the register 5322 once. The arithmetic circuit 5323 performs calculation based on the inputted signal and specifies an address to send various instructions to. Meanwhile, the signal inputted to the decoder 5321 is decoded and the decoded signal is inputted to the control signal generating circuit 5320. The control signal generating circuit 5320 generates a signal including various instructions based on the inputted signal and sends the signal to the address specified by the arithmetic circuit 5323, specifically to the memory 5309, the sending/receiving circuit 5312, the audio processing circuit 5311, the controller 5307, and the like.

The memory 5309, the sending/receiving circuit 5312, the audio processing circuit 5311, and the controller 5307 operate in accordance with the received instructions. Hereinafter the operation is briefly described.

A signal inputted from an inputting means 5325 is sent to the CPU 5308 mounted on the printed wiring substrate 5302 through the I/F portion 5314. The control signal generating circuit 5320 converts image data stored in the VRAM 5316 into a predetermined format in accordance with the signal sent from the inputting means 5325 such as a pointing device or a keyboard and sends the converted image data to the controller 5307.

The controller 5307 processes the signal including the image data which has been sent from the CPU 5308 in accordance with the specification of the panel and supplies the signal to the display panel 5301. The controller 5307 generates a Hsync signal, a Vsync signal, a clock signal CLK, alternating voltage (AC Cont), and a switching signal L/R based on various signals inputted from the CPU 5308 and power source voltage inputted from the power source circuit 5310, and supplies these signals to the display panel 5301.

The sending/receiving circuit 5312 processes a signal which has been sent and received as an electric wave with an antenna 5328 and specifically includes a high-frequency circuit such as an isolator, a bandpass filter, a VCO (Voltage Controlled Oscillator), an LPF (Low Pass Filter), a coupler, or a balun. Among the signals sent to and received from the sending/receiving circuit 5312, a signal including audio information is sent to the audio processing circuit 5311 in accordance with the instruction from the CPU 5308.

The signal including audio information which has been sent in accordance with the instruction of the CPU 5308 is demodulated into an audio signal in the audio processing circuit 5311 and sent to the speaker 5327. The audio signal which has been sent from a microphone 5326 is modulated in the audio processing circuit 5311 and sent to the sending/receiving circuit 5312 in accordance with an instruction from the CPU 5308.

The controller 5307, the CPU 5308, the power source circuit 5310, the audio processing circuit 5311, and the memory 5309 can be mounted as a package in this embodiment. This embodiment can be applied to any circuit other than a high-frequency circuit such as an isolator, a bandpass filter, a VCO (Voltage Controlled Oscillator), an LPF (Low Pass Filter), a coupler, or a balun.

Figure 15:
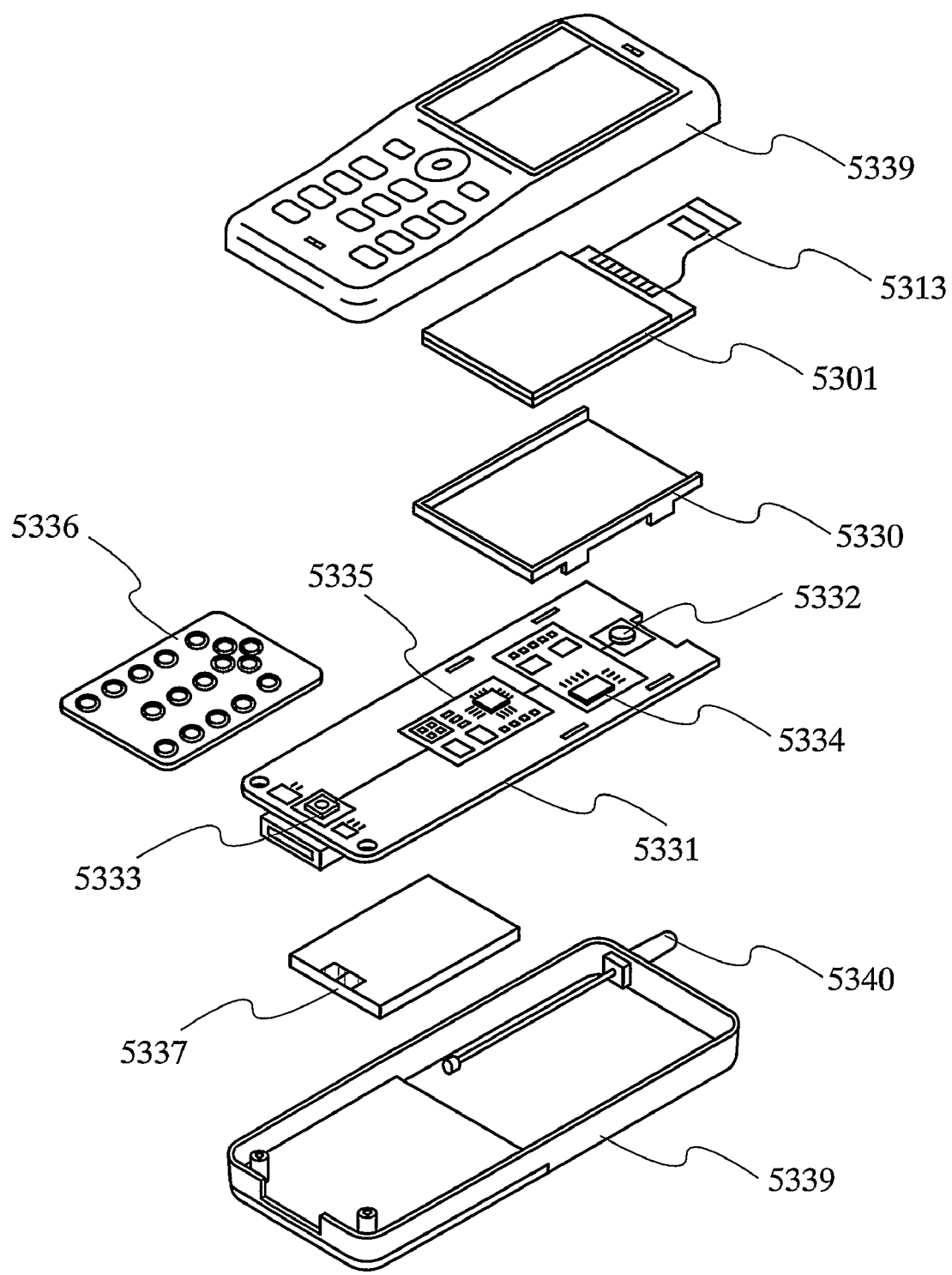
FIG. 15 shows an electronic appliance of Embodiment 4.

FIG. 15 shows a mode of a mobile phone including the module shown in FIGS. 14A and 14B. The display panel 5301 is detachably incorporated in a housing 5330. The housing 5330 can have any shape and size in accordance with the size of the display panel 5301. The housing 5330 with the display panel 5301 fixed is fitted into a printed substrate 5331 and assembled as a module.

The display panel 5301 is connected to the printed substrate 5331 through the FPC 5313. The printed substrate 5331 is provided with a speaker 5332, a microphone 5333, a sending/receiving circuit 5334, and a signal processing circuit 5335 including a CPU, a controller, and the like. Such a module is combined with an inputting means 5336, a battery 5337, and an antenna 5340 and placed in a housing 5339. A pixel portion of the display panel 5301 is provided so as to be observed from an opening window formed in the housing 5339.

The mobile phone of this embodiment can be changed into various modes in accordance with the function and intended purpose. For example, a plurality of display panels may be provided, or the housing may be divided into plural housings appropriately and the housings may be connected to each other with a hinge so as to open and close.

The mobile phone shown in FIG. 15 has a structure in which pixels included in a semiconductor device similar to those described in Embodiment Mode 1 are arranged in matrix in the display panel 5301. In the semiconductor device, the on/off potential to be applied to a gate electrode of a driver transistor and the potential of the amplitude of a data line in the pixel can be separately set. Therefore, the amplitude of the data line can be set small and the power consumption of the semiconductor device can be drastically suppressed. Since the display panel 5301 including the semiconductor device has a similar characteristic, drastic reduction of power consumption is achieved in the mobile phone. This characteristic makes it possible to drastically decrease the number of power source circuits or reduce the size thereof; therefore, the housing 5339 can be lighter in weight. Since the mobile phone of the present invention consumes less electric power and is light in weight, products with improved portability can be provided to customers.

Figure 16A:
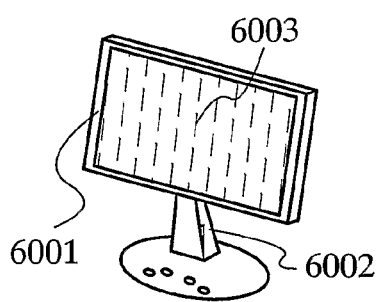
FIGS. 16A to 16E show electronic appliances of Embodiment 4.

FIG. 16A shows a television device including a housing 6001, a supporter 6002, a display portion 6003, and the like. In this television device, pixels included in a semiconductor device similar to those described in Embodiment Mode 1 are arranged in matrix in the display portion 6003. In the semiconductor device, the on/off potential to be applied to a gate electrode of a driver transistor and the potential of the amplitude of a data line in the pixel can be separately set. Therefore, the amplitude of the data line can be set small and the power consumption of the semiconductor device can be drastically suppressed. Since the display portion 6003 including the semiconductor device has a similar characteristic, drastic reduction of power consumption is achieved in the television device. Since this characteristic makes it possible to drastically decrease the number of power source circuits or reduce the size thereof, the housing 6001 can be lighter in weight. Since the television device of the present invention consumes less electric power and is lighter in weight, products suitable for dwelling environment can be provided to customers.

Figure 16B:
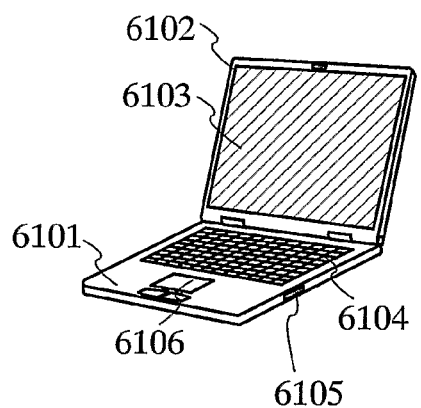

FIG. 16B shows a computer including a main body 6101, a housing 6102, a display portion 6103, a keyboard 6104, an external connection port 6105, a pointing mouse 6106, and the like. In the computer, pixels included in a semiconductor device similar to those described in Embodiment Mode 1 are arranged in matrix in the display portion 6103. In the semiconductor device, the on/off potential to be applied to a gate electrode of a driver transistor and the potential of the amplitude of a data line in the pixel can be separately set. Therefore, the amplitude of the data line can be set small and the power consumption of the semiconductor device can be drastically suppressed. Since the display portion 6103 including the semiconductor device has a similar characteristic, drastic reduction of power consumption is achieved in the computer. This characteristic makes it possible to drastically decrease the number of power source circuits or reduce the size thereof; therefore, the main body 6101 and the housing 6102 can be lighter in weight. Since the computer of the present invention consumes less electric power and is lighter in weight, products with high convenience can be provided to customers.

Figure 16C:
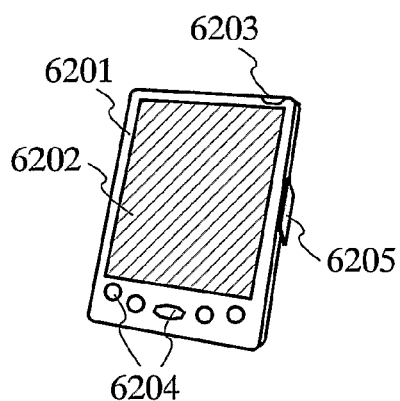

FIG. 16C shows a mobile computer including a main body 6201, a display portion 6202, a switch 6203, operation keys 6204, an infrared port 6205, and the like. In the mobile computer, pixels included in a semiconductor device similar to those described in Embodiment Mode 1 are arranged in matrix in the display portion 6202. In the semiconductor device, the on/off potential to be applied to a gate electrode of a driver transistor and the potential of the amplitude of a data line in the pixel can be separately set. Therefore, the amplitude of the data line can be set small and the power consumption of the semiconductor device can be drastically suppressed. Since the display portion 6202 including the semiconductor device has a similar characteristic, drastic reduction of power consumption is achieved in the mobile computer. This characteristic makes it possible to drastically decrease the number of power source circuits or reduce the size thereof; therefore, the main body 6201 can be lighter in weight. Since the mobile computer of the present invention consumes less electric power and is lighter in weight, products with high convenience can be provided to customers.

Figure 16D:
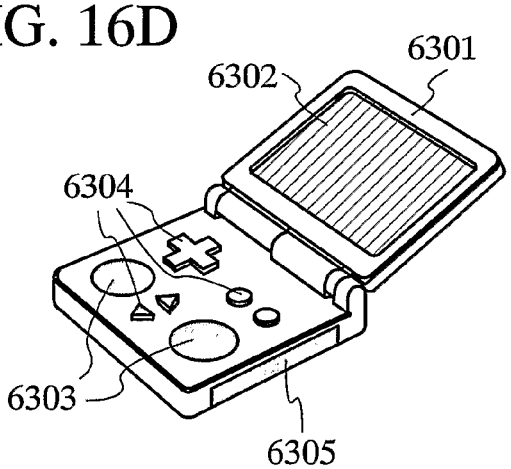

FIG. 16D shows a mobile game machine including a housing 6301, a display portion 6302, speaker portions 6303, operation keys 6304, a recording medium inserting portion 6305, and the like. In the mobile game machine, pixels included in a semiconductor device similar to those described in Embodiment Mode 1 are arranged in matrix in the display portion 6302. In the semiconductor device, the on/off potential to be applied to a gate electrode of a driver transistor and the potential of the amplitude of a data line in the pixel can be separately set. Therefore, the amplitude of the data line can be set small and the power consumption of the semiconductor device can be drastically suppressed. Since the display portion 6302 including the semiconductor device has a similar characteristic, drastic reduction of power consumption is achieved in the mobile game machine. This characteristic makes it possible to drastically decrease the number of power source circuits or reduce the size thereof; therefore, the housing 6301 can be lighter in weight. Since the mobile game machine of the present invention consumes less electric power and is lighter in weight, products with high convenience can be provided to customers.

Figure 16E:
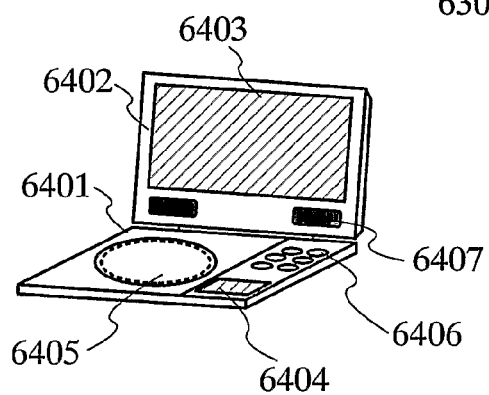
Figure 17A:
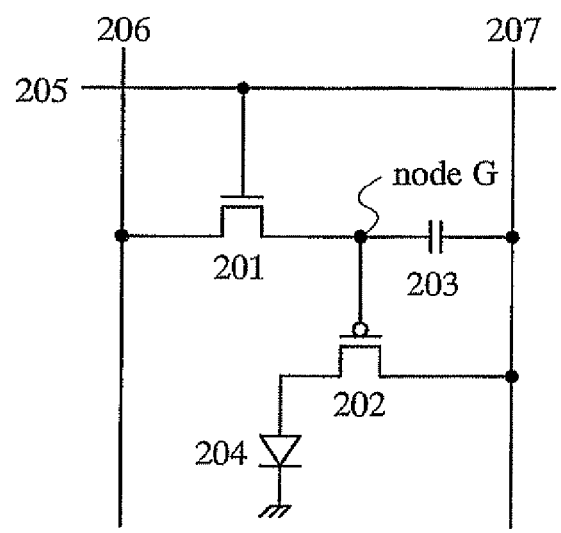
FIGS. 17A and 17B show a conventional example.
Figure 17B:
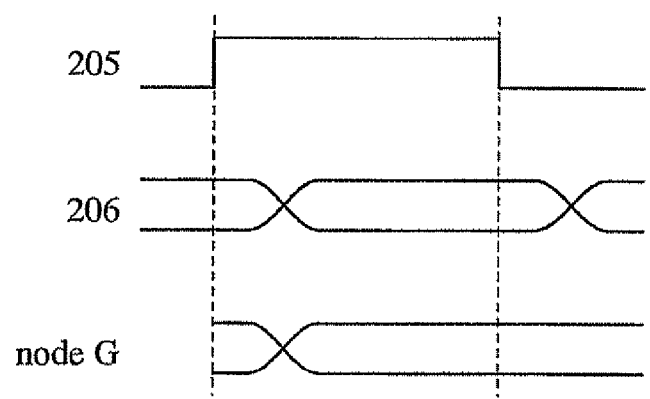

FIG. 16E shows a mobile image reproducing device equipped with a recording medium (specifically a DVD reproducing device), including a main body 6401, a housing 6402, a display portion A 6403, a display portion B 6404, a recording medium (such as a DVD) reading portion 6405, an operation key 6406, a speaker portion 6407, and the like. The display portion A 6403 mainly displays image information while the display portion B 6404 mainly displays text information. In this image reproducing device, pixels included in a semiconductor device similar to those described in Embodiment Mode 1 are arranged in matrix in the display portions A 6403 and B 6404. In the semiconductor device, the on/off potential to be applied to a gate electrode of a driver transistor and the potential of the amplitude of a data line in the pixel can be separately set. Therefore, the amplitude of the data line can be set small and the power consumption of the semiconductor device can be drastically suppressed. Since the display portions A 6403 and B 6404 including the semiconductor devices have similar characteristics, drastic reduction of power consumption is achieved in the image reproducing device. This characteristic makes it possible to drastically decrease the number of power source circuits or reduce the size thereof; therefore, the main body 6401 and the housing 6402 can be lighter in weight. Since the image reproducing device of the present invention consumes less electric power and is lighter in weight, products with high convenience can be provided to customers.

The display devices used in these electronic appliances can be formed using not only a glass substrate but also a heat-resistant plastic substrate depending on the size, strength, and intended purpose. Accordingly, further reduction in weight can be achieved.

The examples shown in this embodiment are just examples and the present invention is not limited to these.

This embodiment can be combined freely with any description of the above Embodiment Modes and Embodiments.

This application is based on Japanese Patent Application serial no. 2005-119676 filed in Japan Patent Office on Apr. 18, 2005, the entire contents of which are hereby incorporated by reference.

The invention claimed is:

1. A semiconductor device comprising:
   a light-emitting element;
   a scan line;
   a data line;
   a current supply line;
   a first transistor of which one of a source and a drain is connected to the current supply line and the other is connected to one electrode of the light-emitting element;
   a second transistor of which a gate is connected to the data line, one of a source and a drain is connected to the scan line, and the other is connected to a gate of the first transistor; and
   a third transistor of which a gate and one of a source and a drain are connected to the scan line and the other of the source and the drain is connected to the other of the source and the drain of the second transistor.

2. A semiconductor device according to claim 1,
   wherein the first transistor is a P-channel transistor and the second transistor and the third transistor are N-channel transistors.

3. A semiconductor device comprising:
   a light-emitting element;
   a scan line;
   a data line;
   a current supply line;
   a first transistor of which one of a source and a drain is connected to the current supply line and the other is connected to one electrode of the light-emitting element;
   a second transistor of which a gate is connected to the data line, one of a source and a drain is connected to the scan line, and the other is connected to a gate of the first transistor; and
   a diode of which one electrode is connected to the scan line and the other electrode is connected to the other of the source and the drain of the second transistor.

4. A semiconductor device according to claim 3,
   wherein the first transistor is a P-channel transistor and the second transistor is an N-channel transistor.

5. A semiconductor device according to claim 1 or 3, further comprising a capacitor,
   wherein the capacitor comprises one electrode connected to the gate of the first transistor and the other electrode connected to the current supply line.

6. A semiconductor device according to claim 1 or 3, further comprising a switch for controlling electrical connection or disconnection between the other of the source and the drain of the second transistor and the gate of the first transistor.

7. A semiconductor device according to claim 1 or 3,
   wherein a potential of the current supply line is higher than a potential of the other electrode of the light-emitting element.

8. A semiconductor device comprising:
   a light-emitting element;
   a scan line;
   a data line;
   a current supply line;
   a node;
   a first transistor of which a gate is connected to the node and one of a source and a drain is connected to the current supply line and the other is connected to one electrode of the light-emitting element; and
   a second transistor which is turned on or off depending on potentials of the data line and the scan line and which determines a potential of the node,
   wherein the potential of the node is set to be a potential for turning off the first transistor without depending on the potential of the data line.

9. A semiconductor device according to claim 8,
   wherein a gate of the second transistor is connected to the data line, one of a source and a drain of the second transistor is connected to the scan line, and the other is connected to the node.

10. A semiconductor device according to claim 8,
    wherein a potential of the current supply line is higher than a potential of the other electrode of the light-emitting element.

11. A semiconductor device according to claim 8,
    wherein the first transistor is a P-channel transistor and the second transistor is an N-channel transistor.

12. A semiconductor device comprising:
    a light-emitting element;
    a scan line;
    a data line;

a current supply line;

a first node;

a second node;

a first transistor of which a gate is connected to the first node and one of a source and a drain is connected to the current supply line and the other is connected to one electrode of the light-emitting element;

a second transistor which is turned on or off depending on potentials of the data line and the scan line and which determines a potential of the second node; and a switch for controlling electrical connection or disconnection between the first node and the second node, wherein the potential of the second node is set to be a potential for turning off the first transistor without depending on the potential of the data line.

13. A semiconductor device according to claim 12, wherein a gate of the second transistor is connected to the data line, one of a source and a drain of the second transistor is connected to the scan line, and the other is connected to the second node.

14. A semiconductor device according to claim 12, wherein a potential of the current supply line is higher than a potential of the other electrode of the light-emitting element.

15. A semiconductor device according to claim 12, wherein the first transistor is a P-channel transistor and the second transistor is an N-channel transistor.

16. A semiconductor device comprising:

a light-emitting element;

a first scan line;

a second scan line;

a data line;

a current supply line;

a first transistor of which one of a source and a drain is connected to the current supply line and the other is connected to one electrode of the light-emitting element;

a second transistor of which a gate is connected to the data line, one of a source and a drain is connected to the first scan line, and the other is connected to a gate of the first transistor;

a third transistor of which a gate and one of a source and a drain are connected to the first scan line and the other of the source and the drain is connected to the other of the source and the drain of the second transistor; and a fourth transistor of which a gate is connected to the second scan line, one of a source and a drain is connected to the other of the source and the drain of the second transistor, and the other of the source and the drain is connected to the gate of the first transistor.

17. A semiconductor device according to claim 16, wherein the first transistor is a P-channel transistor and the second to fourth transistors are N-channel transistors.

18. A semiconductor device comprising:

a light-emitting element;

a first scan line;

a second scan line;

a data line;

a current supply line;

a first transistor of which one of a source and a drain is connected to the current supply line and the other is connected to one electrode of the light-emitting element;

a second transistor of which a gate is connected to the data line, one of a source and a drain is connected to the first scan line, and the other is connected to a gate of the first transistor;

a diode of which one electrode is connected to the first scan line and the other electrode is connected to the other of the source and the drain of the second transistor; and a fourth transistor of which a gate is connected to the second scan line, one of a source and a drain is connected to the other of the source and the drain of the second transistor, and the other of the source and the drain is connected to the gate of the first transistor.

19. A semiconductor device according to claim 18, wherein the first transistor is a P-channel transistor and the second and fourth transistors are N-channel transistors.

20. A semiconductor device according to claim 16 or 18, further comprising a capacitor, wherein the capacitor comprises one electrode connected to the gate of the first transistor and the other electrode connected to the current supply line.

21. A semiconductor device according to claim 16 or 18, wherein a potential of the current supply line is higher than a potential of the other electrode of the light-emitting element.

22. A semiconductor device comprising:

a light-emitting element;

a first scan line;

a second scan line;

a data line;

a current supply line;

a first transistor of which one of a source and a drain is connected to the current supply line and the other is connected to one electrode of the light-emitting element;

a second transistor of which a gate is connected to the data line, one of a source and a drain is connected to the first scan line, and the other is connected to a gate of the first transistor;

a third transistor of which a gate is connected to the first scan line, one of a source and a drain is connected to the current supply line, and the other of the source and the drain is connected to the other of the source and the drain of the second transistor; and a fourth transistor of which a gate is connected to the second scan line, one of a source and a drain is connected to the other of the source and the drain of the second transistor, and the other of the source and the drain is connected to the gate of the first transistor.

23. A semiconductor device according to claim 22, wherein the first transistor is a P-channel transistor and the second to fourth transistors are N-channel transistors.

24. A semiconductor device according to claim 22, further comprising a capacitor, wherein the capacitor comprises one electrode connected to the gate of the first transistor and the other electrode connected to the current supply line.

25. A semiconductor device according to claim 22, wherein a potential of the current supply line is higher than a potential of the other electrode of the light-emitting element.

26. A display device wherein each pixel comprises the semiconductor device described in any one of claims 1, 3, 8, 12, 16, 18 and 22.

27. An electronic appliance equipped with the display device according to claim 26.

* * * * *